US010422942B2

(12) United States Patent
Peeters

(10) Patent No.: US 10,422,942 B2
(45) Date of Patent: Sep. 24, 2019

(54) LUMINESCENCE CONCENTRATOR

(71) Applicant: SIGNIFY HOLDING B.V., Eindhoven (NL)

(72) Inventor: Martinus Petrus Joseph Peeters, Eindhoven (NL)

(73) Assignee: SIGNIFY HOLDING B.V., Eindhoven (NL)

( * ) Notice: Subject to any disclaimer, the term of this patent is extended or adjusted under 35 U.S.C. 154(b) by 0 days.

(21) Appl. No.: 15/316,346

(22) PCT Filed: Jun. 1, 2015

(86) PCT No.: PCT/EP2015/062059
§ 371 (c)(1),
(2) Date: Dec. 5, 2016

(87) PCT Pub. No.: WO2015/185469
PCT Pub. Date: Dec. 10, 2015

(65) Prior Publication Data
US 2017/0139113 A1 May 18, 2017

(30) Foreign Application Priority Data

Jun. 5, 2014 (EP) ..................................... 14171242

(51) Int. Cl.
*F21V 9/08* (2018.01)
*F21V 8/00* (2006.01)
(Continued)

(52) U.S. Cl.
CPC ............ *G02B 6/0068* (2013.01); *F21S 41/13* (2018.01); *F21S 41/135* (2018.01); *F21S 41/147* (2018.01); *F21S 41/24* (2018.01); *F21S 41/285* (2018.01); *F21V 9/30* (2018.02); *G02B 1/02* (2013.01); *G02B 6/0003* (2013.01);
(Continued)

(58) Field of Classification Search
CPC ................. F21V 9/08; F21V 9/10; F21V 9/16
See application file for complete search history.

(56) References Cited

U.S. PATENT DOCUMENTS 6,273,589 B1 * 8/2001 Weber ................. H01L 25/0753
257/E25.02
7,196,354 B1 * 3/2007 Erchak .................. H01L 33/507
257/79

(Continued)

FOREIGN PATENT DOCUMENTS

CN 101625076 A 1/2010
CN 102743145 A 10/2012
(Continued)

*Primary Examiner* — Ismael Negron
(74) *Attorney, Agent, or Firm* — Daniel J. Piotrowski

(57) ABSTRACT

An illumination device in dudes a luminescent concentrator with a waveguide having a radiation converter element distributed in the waveguide, and a solid state light source configured to irradiate a radiation input face of the waveguide. The radiation converter element is configured to absorb at least part of the light source radiation and to convert into radiation converter element radiation, wherein the concentration of the converter element in the waveguide is at least three times higher than necessary to absorb 98% of the light source radiation over the width of the waveguide.

14 Claims, 6 Drawing Sheets

(51) Int. Cl.
*F21S 41/135* (2018.01)
*F21S 41/24* (2018.01)
*F21V 9/30* (2018.01)
*F21S 41/20* (2018.01)
*F21S 41/147* (2018.01)
*F21S 41/13* (2018.01)
*H01L 33/50* (2010.01)
*H04N 9/31* (2006.01)
*G03B 21/20* (2006.01)
*G02B 1/02* (2006.01)
*F21Y 115/10* (2016.01)

(52) U.S. Cl.
CPC ......... *G02B 6/0035* (2013.01); *G02B 6/0056* (2013.01); *G02B 6/0075* (2013.01); *G02B 6/0085* (2013.01); *G03B 21/204* (2013.01); *H01L 33/504* (2013.01); *H01L 33/505* (2013.01); *H04N 9/3158* (2013.01); *F21Y 2115/10* (2016.08); *G02B 6/0073* (2013.01); *G02B 6/0076* (2013.01); *H01L 33/501* (2013.01)

(56) References Cited

U.S. PATENT DOCUMENTS

| | | | | |
|---|---|---|---|---|
| 7,235,792 B2 * | 6/2007 | Elofson | ............... | C09K 11/02 250/205 |
| 7,316,497 B2 * | 1/2008 | Rutherford | ............ | H04N 9/315 348/E9.027 |
| 7,982,229 B2 * | 7/2011 | Bechtel | ............... | G02B 6/0068 257/98 |
| 8,393,745 B2 | 3/2013 | Hikmet | | |
| 8,684,555 B2 * | 4/2014 | Hofmann | ............ | A61B 1/00117 257/98 |
| 9,151,884 B2 * | 10/2015 | Rutherford | .......... | G02B 6/0003 |
| 9,482,937 B2 * | 11/2016 | Cheng | ................. | G03B 21/204 |
| 2007/0024173 A1 | 2/2007 | Braune | | |
| 2007/0081329 A1 * | 4/2007 | Chua | ..................... | B82Y 20/00 362/231 |
| 2007/0279914 A1 * | 12/2007 | Rutherford | .......... | G02B 6/0068 362/341 |
| 2007/0279915 A1 * | 12/2007 | Rutherford | .......... | G02B 6/0003 362/341 |
| 2008/0287583 A1 | 11/2008 | Mataki et al. | | |
| 2009/0034230 A1 * | 2/2009 | Lim | ..................... | G02B 6/0028 362/84 |
| 2009/0244923 A1 | 10/2009 | Hofmann et al. | | |
| 2011/0025951 A1 | 2/2011 | Jones | | |
| 2011/0116261 A1 * | 5/2011 | Brukilacchio | ....... | A61B 1/0653 362/231 |
| 2011/0210658 A1 | 9/2011 | Pan et al. | | |
| 2012/0069544 A1 | 3/2012 | Juestel et al. | | |

FOREIGN PATENT DOCUMENTS

| | | |
|---|---|---|
| CN | 103348476 A | 10/2013 |
| DE | 102009037732 A1 | 2/2011 |
| EP | 2346101 A1 | 7/2011 |
| EP | 2560217 A2 | 2/2013 |
| JP | 2007133161 A | 5/2007 |
| RU | 2479072 C2 | 9/2011 |
| WO | 2006054203 A1 | 5/2006 |
| WO | 2010044240 A1 | 4/2010 |
| WO | 2011031871 A1 | 7/2011 |
| WO | 2012023094 A2 | 2/2012 |

\* cited by examiner

LUMINESCENCE CONCENTRATOR

CROSS-REFERENCE TO PRIOR APPLICATIONS

This application is the U.S. National Phase application under 35 U.S.C. § 371 of International Application No. PCT/EP2015/062059, filed on Jun. 1, 2015, which claims the benefit of European Patent Application No. 14171242.2, filed on Jun. 5, 2014. These applications are hereby incorporated by reference herein.

FIELD OF THE INVENTION

The invention relates to a luminescent concentrator. The invention also relates to applications thereof, such as a digital projector unit comprising such luminescent concentrator, or an automotive lighting unit comprising such luminescent concentrator.

BACKGROUND OF THE INVENTION

Luminescence concentrators are known in the art. U.S. Pat. No. 7,982,229, for instance, describes amongst others a light emitting device comprising at least one LED which emits light in the wavelength range of ≥220 nm to ≤550 nm and at least one conversion structure placed towards the at least one LED without optical contact, which converts at least partly the light from the at least one LED to light in the wavelength range of ≥300 nm to ≤1000 nm, characterized in that the at least one conversion structure has a refractive index n of ≥1.5 and ≤3 and the ratio A:E is ≥2:1 and ≤50000:1, where A and E are defined as follows: the at least one conversion structure comprises at least one entrance surface, where light emitted by the at least one LED can enter the conversion structure and at least one exit surface, where light can exit the at least one conversion structure, each of the at least one entrance surfaces having an entrance surface area, the entrance surface area(s) being numbered $A_1 \ldots A_n$ and each of the at least one exit surface(s) having an exit surface area, the exit surface area(s) being numbered $E_1 \ldots E_n$ and the sum of each of the at least one entrance surface(s) area(s) A being $A=A_1+A_2 \ldots +A_n$ and the sum of each of the at least one exit surface(s) area(s) E being $E=E_1+E_2 \ldots +E_n$.

US2011/0025951 describes a spectral conversion device including a plurality of discrete units dyed with a photoluminescent material at a concentration greater than or equal to an amount sufficient to absorb and convert substantially all input light from a light source to a desired output spectrum, and a coating material disposed around the discrete units, wherein the coating material binds the plurality of discrete units to form a matrix, wherein when the plurality of discrete units are positioned over the light source, the input light passing through the transparent discrete units is not converted, and the input light passing through the doped discrete units is converted to red and green wavelengths, further wherein the emitted input light and the converted red and green light correspond to the desired output spectrum to produce one or more colors. An associated method and an associated device used with flat panel image displays are also provided.

SUMMARY OF THE INVENTION

High brightness sources can be created using LEDs in combination with a luminescent concentrator. The light that can be outcoupled from the luminescent concentrator is in some instances at maximum about 18% of the converted light. Hence, it is an aspect of the invention to provide an alternative lighting device comprising a concentrator, which preferably further at least partly obviate one or more of above-described drawbacks. It is an aspect of the invention to provide an alternative lighting unit, such as an automotive lighting unit, comprising such a concentrator, which preferably further at least partly obviate one or more of above-described drawbacks. It is yet a further aspect of the invention to provide an alternative application unit, such as a digital projector, comprising such a concentrator, which preferably further at least partly obviate one or more of above-described drawbacks.

For such luminescent concentrators, e.g. ceramic materials, single crystals or optically transmissive polymers can be used. The ceramic converters should be extremely transparent to be efficient (light should especially remain in total internal reflection (TIR) until the end of the concentrator, such as a concentrator rod and not be deflected by an irregularity). Such concentrators include luminescent elements (herein indicated as radiation converter elements) that convert incoming light into converted light. The converted light is retrieved from the concentrator, especially from an end face of e.g. a concentrator rod. The luminescent element converts the radiation (such as UV and/or blue) from the source into emission (such as green, yellow, orange or red) and is therefore indicated as converter or as "wavelength converter" or "radiation converter", as it converts radiation from a source (the solid state light source radiation) into other radiation (the radiation converter element radiation). The emission of the radiation converter element is herein also indicated as radiation converter element radiation.

The radiation converter element concentration is in general chosen such that substantially all radiation from the light source is absorbed over the width the radiation from the radiation source travels from a radiation input face to an opposite face. For instance, assuming a 1.2 mm wide ceramic rod comprising $Lu_3Al_5O_{12}$:Ce (III), the Ce concentration is about 0.175% in the rod, which implies that about 98% of the blue radiation of the light source is absorbed by the cerium ion in the concentrator rod. A substantially higher concentration is considered not to add to the conversion efficiency (blue to green) and may only increase costs. It will also further shift the color point to the red. However, it has surprisingly been found that when the cerium concentration is substantially increased, the concentrator efficiency increases. It is expected that the efficiency can increase with about 10-20%.

Hence, in a first aspect the invention provides a lighting device comprising: (i) a luminescent concentrator ("concentrator"), the luminescent concentrator comprising a waveguide (or "light guide") having a radiation input face ("input face"), a radiation exit face ("exit face"), and a width (W) being defined by the radiation input face and an opposite face, the waveguide comprising a radiation converter element distributed in the waveguide with a radiation converter concentration ("converter concentration"); and (ii) a solid state light source configured to irradiate the radiation input face of the waveguide with solid state light source radiation; wherein the radiation converter element is configured to absorb at least part of the light source radiation and to convert into radiation converter element radiation, and wherein the radiation converter concentration is selected at least three times higher than necessary to absorb 98% of the light source radiation over the width (W) of the waveguide, as further defined in the accompanying claims.

With such a lighting device, a substantial higher concentrator efficiency can be obtained. For instance, referring to configurations wherein about 18% of the converted light escapes from the radiation exit face, now this value can be increased to 20-24% when using the same luminescent concentrator, but having a substantially increased radiation converter concentration. The radiation converter elements used in general have an overlap between excitation and emission spectrum, leading to reabsorption. After the reabsorption, a red shifted re-emission is generated. Only part of this isotropic emission will be in total internal reflection domain (TIR). Re-absorption can thus be described as a scattering process. Unlike scattering, re-absorption will stop if the light is significantly red shifted. In the case that the radiation converter concentration is low, re-absorption in the length direction of the rod is dominant. Light that was originally in TIR, is likely to escape from TIR due this reabsorption process. Moreover, light that was in the primary emission not in TIR, will have a lower chance to be re-absorbed and will escape from the rod before it reaches the exit surface.

However, when the radiation converter concentration is increased also re-absorption in other directions becomes important, which may be significant. The primary light generated that is not in the TIR cone will undergo reabsorption, giving it a second chance to enter the TIR cone. In the length direction (see also below), re-absorption will not increase significantly, only the distance from the primary emission will decrease (the aspect ratio (of length/width, the length being larger than the width) of the rod result in reabsorption in the length direction, even for lower concentrations). Hence, the concentration efficiency can be increased unexpectedly with a higher converter concentration. Especially, the radiation converter concentration is at least 2 times higher, even more especially at least 3 times higher, like especially selected from the range of 4-8 times higher than necessary to absorb 98% of the light source radiation over the width (W) of the waveguide. At a concentration lower than 3, especially lower than 2, times necessary to absorb 98% of the light source radiation, or on the other hand, higher than about 8 times, the effects may be smaller, or even start to decrease again (at too high concentrations). For instance, at factors of about 8 or higher the color point change may be undesired large, quenching may occur, and/or quantum efficiency may drop.

The absorption follows in general the Lambert-Beer law. Hence, the concentration may depend upon the species used (absorptivity of the attenuator, $\varepsilon$, and the concentration c of attenuating species in the material, or a total (absorption and scattering) cross section, $\sigma$, as known in the art), and the optical path length (or width) (l). The transmission or absorption condition can be determined relative easy. The wavelength of the radiation maximum of the solid state light source radiation is defined. This is in general indicated as LED wavelength for commercial LEDs. For the radiation converter element the absorption coefficient at this wavelength is known, or can be determined. Determination can simply be done by providing a known amount of the radiation converter element in the waveguide material, especially in a body having two parallel faces, and determine the transmission. This is known in the art for determining absorptivity, extinction coefficient and transmission. The transmission or light permeability can be determined by providing light at a specific wavelength, here the wavelength of the radiation maximum of the solid state light source, with a first intensity ($I_0$) to the material and relating the intensity ($I_t$) of the light at that wavelength measured after transmission through the material, to said first intensity of the light provided at said specific wavelength to the material (see also E-208 and E-406 of the CRC Handbook of Chemistry and Physics, 69th edition, 1088-1989). The first intensity ($I_0$) is thus especially the intensity upstream of the radiation input face and the intensity ($I_t$) is especially the radiation downstream of radiation downstream of the face opposite of said radiation input face. In this way, the absorption coefficient ($\varepsilon$) can be derived. Now, it is defined which waveguide will be used, i.e. what the relevant width will be. The latter will thus define the distance the light travels through the material, i.e. the path length (l). Then, all parameters are known to define the concentration of the radiation converter element at which 98% of the radiation at the radiation maximum wavelength will be absorbed when the radiation converter element is available at that concentration in the waveguide and is irradiated with the radiation (of the solid state light source at the radiation input face, having an opposite face at a distance or relevant width (W) as predefined). Based thereon, the at least threefold of this concentration is chosen and the waveguide having this at least threefold concentration of the radiation converter element is provided.

For instance, assume the transmission should be 2% (98% absorption), assume the concentration of the radiation converter element is 1, and the width or path length (l) is also 1 (with for the sake of simplicity dimensions are adjusted to each other), then the absorptivity of this (fictive) radiation converter element is apparently $(\log(0.02))/(-1*1)=1.699$, as $\log(T)=-\varepsilon*l*c$ (Lambert-Beer equation), and $T=I_t/I_0=0.02$, $l=1$ and $c=1$. Assume now that a waveguide is desired of half the width, then the concentration for 98% absorption of this radiation converter element will be (log (0.02))/(1.699*0.5)=2. Therefore, when the condition of at least three times the concentration is chosen, such as 3 or 4 times, the concentration of this radiation converter element in this waveguide having a thickness of 0.5 would be 3 or 4 times the concentration of 2, i.e. 6 or 8 (again dimensions have been adjusted to each other for the sake of simplicity).

Further, best results are obtained when the excitation spectrum and emission spectrum partly overlap. The radiation of the solid state light source excites the radiation converter element, which provides on its turn the converter element radiation or emission. Hence, in an embodiment the radiation converter element comprises a radiation excitation spectrum and a radiation emission spectrum that spectrally partly overlap. Especially, there is no total overlap (such as in the case of a zero Stokes shift), as it is desirable that the reabsorption process is not "infinite". Hence, especially the overlapping area of the excitation spectrum and emission spectrum is in the range of 2-50% of the emission spectrum, especially 5-25% of the emission spectrum. Even more especially, the overlapping area of the excitation spectrum and emission spectrum within the visible wavelength range is in the range of 2-50% of the emission spectrum (within the visible wavelength range), especially 5-25% of the emission spectrum. An example of a suitable luminescent material that can be used in the waveguide to provide the radiation converter element is $Lu_3Al_5O_{12}$:Ce. Here, the lowest excitation band and the emission band partly overlap. Hence, especially a radiation converter element is chosen that shows in the waveguide (material) an overlap of the emission (spectrum) with the excitation (spectrum). Even more especially, the radiation converter element has an emission spectrum (induced by excitation with the solid state light source radiation) and an excitation spectrum (of said emission or radiation converter element radiation), wherein 5-25% of the emission spectrum overlap with the excitation spectrum. The spectral overlap can be determined by normalizing the excitation spectrum and emission spectrum, especially in the visible range, and defining the area under the emission curve overlapping with the area under the excitation curve. The excitation spectrum is especially the excitation spectrum at the wavelength of maximum emission (i.e. one records the excitation spectrum with a detector measuring the emission at a fixed wavelength, especially the wavelength where the emission is maximum, as known to a person skilled in the art). Further, as the excitation spectrum and especially the emission spectrum may (slightly) depend upon the concentration, the relevant excitation spectrum and emission spectrum are those of the radiation converter element embedded in the waveguide at the herein indicated concentration (while especially monitoring or measuring the emission escaping from the radiation input face, as some emission may also escape from this face).

The waveguide thus further comprises a radiation converter element. This may especially be a luminescent ion element (such as cerium in the above example), a luminescent molecule (dye), or luminescent quantum dot, etc. Examples are further defined below. The radiation converter element absorbs at least part of the radiation of the light source and converts this radiation into radiation converter element radiation (i.e. wavelength conversion). This radiation converter element radiation may escape from the waveguide (especially at the radiation exit face). However, optionally this radiation converter element radiation is converted by another element distributed in the waveguide, which converts the radiation converter element radiation into other luminescence, also called secondary radiation converter element radiation. In such an embodiment, the radiation converter element radiation may be used as sensitizer. Herein, the invention is especially described in relation to a radiation converter element that provides the radiation that is desired to escape from the waveguide. Of course, the radiation escaping from the waveguide may also again be converted, when desired, e.g. with the addition of a phosphor wheel.

The luminescent converter comprises a waveguide, which especially has an aspect ratio larger than 1, i.e. the length (L) is larger than the width (W). In general, the waveguide is a rod or bar (beam), though the waveguide does not necessarily have a square, rectangular or round cross-section. In general, the light source is configured to irradiate one of the longer faces (side edge), herein indicated as radiation input face, and radiation escapes from a face at a front (front edge), herein indicated as radiation exit face. Especially, in embodiments the solid state light source is not in physical contact with the waveguide. Physical contact may lead to undesired outcoupling and thus a reduction in concentrator efficiency. Further, in general the waveguide comprises two substantially parallel faces, the radiation input face and opposite thereof the opposite face. These two faces define herein the width of the waveguide. In general, the length of these faces defines the length of the waveguide. However, as indicated above, and also below, the waveguide may have any shape, and may also include combinations of shapes. Especially, the radiation input face has an radiation input face area (A), wherein the radiation exit face has a radiation exit face area (E), and wherein the radiation input face area (A) is at least two times larger than the radiation exit face area (E), especially at least 5 times larger, such as in the range of 2-50,000, especially 5-5,000 times larger. This allows e.g. the use of a plurality of solid state light sources (see also below). For typical applications like in automotive or digital projectors, a small but high intense emissive surface is desired. This cannot be obtained with a single LED, but can be obtained with the present lighting device. Especially, the radiation exit face has a radiation exit face area (E) selected from the range of 1-100 mm$^2$. With such dimensions, the emissive surface can be small, whereas nevertheless high intensity may be achieved. As indicated above, the waveguide in general has an aspect ratio (defined as length/width). This allows a small radiation exit surface, but a large radiation input surface, e.g. irradiated with a plurality of solid state light sources. In a specific embodiment, the waveguide has a width (W) selected from the range of 0.5-100 mm. The waveguide is thus especially an integral body, having the herein indicated faces.

The phrase "the radiation converter concentration is at least 2 times higher, even more especially at least 3 times higher, like especially selected from the range of 4-8 times higher than necessary to absorb 98% of the light source radiation over the width (W) of the waveguide" and similar phrases especially refer to combinations of a solid state light source and a radiation converter element, wherein the solid state light source is especially optimized for the radiation converter element excitation. Hence, the solid state light source is configured to provide solid state light source radiation, which has an intensity maximum at a wavelength where also the radiation converter concentration can be excited well (to provide the radiation converter element radiation). Especially, the solid state light source is configured to provide solid state source radiation at a wavelength where the radiation converter concentration has an excitation (intensity) in the range of 70-100% of the excitation maximum (intensity), especially in the range of 85-100% of the excitation maximum. For instance, assuming a cerium containing garnet having its lowest excitation band between about 400-530 nm, the 70% range can be found between about 420-490 nm. The solid state light source is then especially configured to have an emission or radiation maximum in the range of 420-490 nm.

The term "radiation converter element" may in an embodiment also refer to two or more different radiation converter elements, e.g. a combination of LuAG:Ce and YAG:Ce, or a combination of a cerium containing garnet and quantum dots. Note that in the former example, the radiation converter elements are in fact the same (cerium), but the chemical environments differ, whereby also the excitation spectra and emission spectra differ, as known in the art. In such instance(s), wherein two or more different radiation converter elements are applied, the phrase "the radiation converter concentration is at least 2 times higher, even more especially at least 3 times higher, like especially selected from the range of 4-8 times higher than necessary to absorb 98% of the light source radiation over the width (W) of the waveguide" and similar phrases especially refer to at least one of the radiation converter elements (and its concentration). The other radiation converter elements may or may not be available in concentrations at least 2 times higher, even more especially at least 3 times higher, like especially selected from the range of 4-8 times higher than necessary to absorb 98% of the light source radiation over the width (W) of the waveguide.

As indicated herein, the term "solid state light source" may also refer to a plurality of solid state light sources. In an embodiment, these are substantially identical solid state light sources, i.e. providing substantially identical spectral distributions of the solid state light source radiation. However, in other embodiments there may be two or more subsets of different solid state light sources, with each subset including one or more solid state light sources, and each subset configured to provide solid state light source radiation (having mutually different spectral distributions). In such instances, the phrase "the radiation converter concentration is at least 2 times higher, even more especially at least 3 times higher, like especially selected from the range of 4-8 times higher than necessary to absorb 98% of the light source radiation over the width (W) of the waveguide" and similar phrases especially refer to at least one combination of (i) a subset of one or more solid state light sources and the (ii) radiation converter element (and its concentration).

In embodiments, the solid state light sources may be configured to irradiate different faces of the waveguide. In such instances and when the width of material downstream of the faces that are irradiated differ (such as may be the case when the waveguide has e.g. no square cross-section), the phrase "the radiation converter concentration is at least 2 times higher, even more especially at least 3 times higher, like especially selected from the range of 4-8 times higher than necessary to absorb 98% of the light source radiation over the width (W) of the waveguide" and similar phrases especially refer to at least one combination of (i) solid state light source(s) and (ii) converter element for (iii) one specific width. For instance, assuming irradiation of two light sources which are perpendicular arranged relative to a waveguide having a first width and a second thickness, which are not equal, then said condition may only apply for the first width, and optionally also for the second thickness. However, when a plurality of solid state light sources are applied, they may optionally irradiate the waveguide at different faces, but still face the same relevant width of the waveguide, which would especially be the case when the solid state light sources are arranged in a 180° configuration with the waveguide in between.

As indicated above, the waveguide may especially comprise a single crystal or a ceramic. With such systems, the desired transparency can be obtained and reflection at grain boundaries or imperfections can be reduced. In yet another embodiment, the waveguide comprises a glass or a polymer. Especially in case of organic radiation converter elements and/or quantum dot based radiation converter elements, it may be desirable to use a glass, such as a low melting glass, or a polymer. The radiation converter element is distributed over the waveguide. Hence, the radiation converter element is embedded in the waveguide, or doped in the waveguide, or solved in the waveguide, or dispersed in the waveguide. The radiation converter element may also be part of a larger structure, such a crystalline host. This crystalline host may be dispersed in the waveguide (or may be used as such, see also below).

Further specific radiation converter elements are described below, but especially, the waveguide may comprise a cerium doped garnet of the $A_3B_5O_{12}$ type. This garnet can be used as waveguide, or can be embedded in a waveguide, e.g. of a similar material. These types of garnets can be provided as single crystal and can also be well provided as ceramic material of a high quality. Cerium, the radiation converter element, provides upon excitation with blue and/or UV radiation in these materials a green-orange luminescence, depending upon the type of garnet and the cerium concentration. Hence, especially in these embodiments with the cerium doped garnet, the solid state light source is configured to irradiate the radiation input face of the waveguide with one or more of UV and blue solid state light source radiation. In a specific embodiment (see further also below), A comprises Ce and one or more of Y, Gd, Tb, Lu, with especially in the range of 0.01-2 mole % of Ce, and especially at least 90 mole % of Lu, relative to the total amount of A, and wherein B comprises one or more of Al, Ga and Sc, with at least 50 mole % of Al relative to the total amount of B. For instance, the cerium doped garnet may comprise $(Lu_{1-x}Ce_x)_3(Al_{1-y}Ga_y)_5O_{12}$, with x in the range of 0.0001-0.02, especially with x in the range of 0.001-0.01, like in the range of 0.001-0.005 (i.e. 0.1-0.5 mole % of A comprises cerium), and with y in the range of 0-0.5. Especially, y is substantially zero, i.e. B comprises substantially Al. This may provide luminescence with desired optical properties, such as efficiency and color point. As indicated above, the lighting device may comprise a plurality of solid state light sources configured to irradiate the radiation input face of the waveguide with solid state light source radiation. The more solid state light sources, the higher the intensity the radiation from the radiation exit surface can be. The plurality of light sources does not necessarily all radiate the same type of radiation. Combinations of blue and/or UV may e.g. be provided. It is also possible to use the waveguide as mixing chamber and combine radiation that can excite the radiation converter element and radiation that does not substantially excite the radiation converter element. For instance, assuming a radiation converter element that absorbs in the blue and converts to green, the solid state light sources may provide blue light for conversion, and red light for admixing. From the radiation exit face green and red light (and in some instance some blue) may be retrieved. The light for admixing to the radiation (that is converted) in the waveguide may, for example, be coupled into the waveguide at a face opposite of the radiation exit surface.

The lighting device may further include one or more cooling elements configured to cool the waveguide. Further, the lighting device may further include one or more reflectors, especially configured to reflect radiation back into the waveguide that escapes from one or more other faces than the radiation exit face. Especially, a face opposite of the radiation exit face may include such a reflector, though in an embodiment not in physical contact therewith. Further, the lighting device may include a heat sink configured to facilitate cooling of the solid state light source and/or luminescent concentrator. The heat sink may comprise or consist of copper, aluminum, silver, gold, silicon carbide, aluminum nitride, boron nitride, aluminum silicon carbide, beryllium oxide, silicon-silicon carbide, aluminum silicon carbide, copper tungsten alloys, copper molybdenum carbides, carbon, diamond, graphite, and combinations of two or more thereof.

In yet a further aspect, the invention provides a lighting unit configured to provide visible light, wherein the lighting unit comprises at least one lighting device as defined herein. For instance, such a lighting unit may comprise also other optics, like one or more of optical filters, collimators, reflectors, wavelength converters, etc. The lighting unit may e.g. be a lighting unit for use in an automatic application, like a headlight. Hence, the invention also provides an automotive lighting unit configured to provide visible light, wherein the automotive lighting unit comprises at least one lighting device as defined herein and/or a digital projector unit comprising at least one lighting device as defined herein. Especially, the lighting device may be configured (in such applications) to provide green light or red light. In a specific embodiment, such a lighting unit comprises at least a first lighting device configured to provide green light and at least a second lighting device configured to provide red light. Blue light may e.g. be provided by the same solid state light sources, but without use of the luminescent concentrator. In this way, e.g. white light may be provided. Alternatively or additionally, blue radiation may be generated with the concentrator. In such instance, the solid state light source is especially configured to provide radiation having a wavelength at 420 nm or below, such as 410 nm or below, like 400 nm or below, like 390 nm or below, especially in the (near) UV and the radiation converter element is configured to absorb at least part of this radiation and convert into blue radiation converter element radiation.

Hence, especially the lighting device is configured to provide visible radiation converter radiation. Further, especially the lighting device is configured to provide (visible) radiation converter radiation downstream of the radiation exit face (upon irradiation of the radiation input face with the solid state light source radiation). The invention further provides the waveguide per se.

The lighting device may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, green house lighting systems, horticulture lighting, or LCD backlighting.

The term "substantially" herein, such as in "substantially all light" or in "substantially consists", will be understood by the person skilled in the art. The term "substantially" may also include embodiments with "entirely", "completely", "all", etc. Hence, in embodiments the adjective substantially may also be removed. Where applicable, the term "substantially" may also relate to 90% or higher, such as 95% or higher, especially 99% or higher, even more especially 99.5% or higher, including 100%. The term "comprise" includes also embodiments wherein the term "comprises" means "consists of". The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

The devices herein are amongst others described during operation. As will be clear to the person skilled in the art, the invention is not limited to methods of operation or devices in operation.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. Use of the verb "to comprise" and its conjugations does not exclude the presence of elements or steps other than those stated in a claim. The article "a" or "an" preceding an element does not exclude the presence of a plurality of such elements. The invention may be implemented by means of hardware comprising several distinct elements, and by means of a suitably programmed computer. In the device claim enumerating several means, several of these means may be embodied by one and the same item of hardware. The mere fact that certain measures are recited in mutually different dependent claims does not indicate that a combination of these measures cannot be used to advantage.

The invention further applies to a device comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Furthermore, some of the features can form the basis for one or more divisional applications.

BRIEF DESCRIPTION OF THE DRAWINGS

Embodiments of the invention will now be described, by way of example only, with reference to the accompanying schematic drawings in which corresponding reference symbols indicate corresponding parts, and in which.

Figure 1:
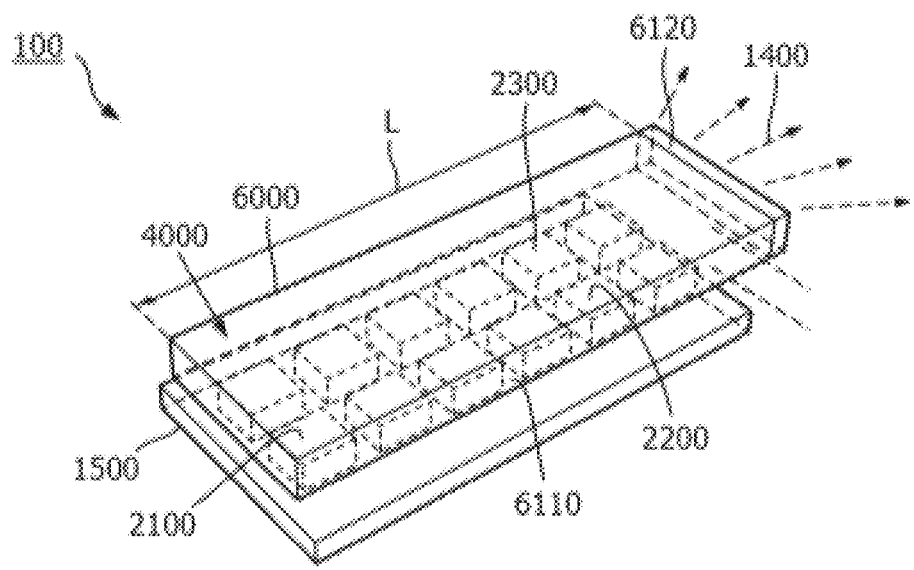
FIG. 1 shows a 3-dimensional perspective view of a light emitting device comprising an exit phosphor, wherein especially the waveguide is configured as concentrator.

The drawings are not necessarily on scale.

DETAILED DESCRIPTION OF THE EMBODIMENTS

As illustrated in the figures, the sizes of layers, elements and regions are exaggerated for illustrative purposes and, thus, are provided to illustrate the general structures of embodiments of the present invention. Like reference numerals refer to like elements throughout, such that e.g. a light emitting device according to the invention is generally denoted 1, whereas different specific embodiments thereof are denoted by adding 01, 02, 03 and so forth to the general reference numeral. With regard to FIGS. 1 to 4 showing a number of features and elements which may be added to any one of the embodiments of a light emitting device according to the invention as set forth further below, generally "00" has been added to all elements except those specific to one of these Figures.

The present invention will now be described more fully hereinafter with reference to the accompanying drawings, in which currently preferred embodiments of the invention are shown. This invention may, however, be embodied in many different forms and should not be construed as limited to the embodiments set forth herein; rather, these embodiments are provided for thoroughness and completeness, and fully convey the scope of the invention to the skilled person.

The following description will start with general considerations regarding applications, suitable light sources and suitable materials for various elements and features of a light emitting device according to the invention. For this purpose a number of features and elements which may be added to any one of the embodiments of a light emitting device according to the invention as set forth further below will be described with reference to FIGS. 1 to 4. The specific embodiments of a light emitting device according to the invention will be described in detail with reference to FIGS. 5a to 6d.

A light emitting device according to the invention may be used in applications including but not being limited to a lamp, a light module, a luminaire, a spot light, a flash light, a projector, a digital projection device, automotive lighting such as e.g. a headlight or a taillight of a motor vehicle, arena lighting, theater lighting and architectural lighting.

Light sources which are part of the embodiments according to the invention as set forth below, are adapted for, in operation, emitting light with a first spectral distribution. This light is subsequently coupled into a light guide or waveguide. The light guide or waveguide may convert the light of the first spectral distribution to another spectral distribution and guides the light to an exit surface. The light source may in principle be any type of point light source, but is in an embodiment a solid state light source such as a Light Emitting Diode (LED), a Laser Diode or Organic Light Emitting Diode (OLED), a plurality of LEDs or Laser Diodes or OLEDs or an array of LEDs or Laser Diodes or OLEDs, or a combination of any of these. The LED may in principle be an LED of any color, or a combination of these, but is in an embodiment a blue light source producing light source light in the blue color-range which is defined as a wavelength range of between 380 nm and 495 nm. In another embodiment, the light source is an UV or violet light source, i.e. emitting in a wavelength range of below 420 nm. In case of a plurality or an array of LEDs or Laser Diodes or OLEDs, the LEDs or Laser Diodes or OLEDs may in principle be LEDs or Laser Diodes or OLEDs of two or more different colors, such as, but not limited to, UV, blue, green, yellow or red.

Especially, the light source is a light source that during operation emits (light source light, especially solid state light source radiation) at least light at a wavelength selected from the range of 200-490 nm, especially a light source that during operation emits at least light at wavelength selected from the range of 400-490 nm, even more especially in the range of 440-490 nm. This light may partially be used by the radiation converter element (see further also below). Hence, in a specific embodiment, the light source is configured to generate blue light. Alternatively or additionally, the (solid state) light source is configured to provide radiation at a wavelength selected from the range of 200-600, especially 300-550 nm, like 300-500 nm. Especially light sources that are configured to provide blue and/or green radiation may also be used for exciting red luminescent materials. In a specific embodiment, the light source comprises a solid state LED light source (such as a LED or laser diode). The term "light source" may also relate to a plurality of light sources, such as 2-20 (solid state) LED light sources, though much more may be applied. Hence, the term LED may also refer to a plurality of LEDs. The light source is herein especially indicated as solid state light source (see also above).

The light guides as set forth below in embodiments according to the invention generally may be rod shaped or bar shaped light guides comprising a height H, a width W, and a length L extending in mutually perpendicular directions and are in embodiments transparent, or transparent and luminescent. The light is guided generally in the length L direction. The height H is in embodiments<10 mm, in other embodiments<5 mm, in yet other embodiments<2 mm. The width W is in embodiments<10 mm, in other embodiments<5 mm, in yet embodiments<2 mm. The length L is in embodiments larger than the width W and the height H, in other embodiments at least 2 times the width W or 2 times the height H, in yet other embodiments at least 3 times the width W or 3 times the height H. hence, the aspect ration (of length/width) is especially larger than 1, such as equal to or larger than 2. Unless indicated otherwise, the term "aspect ratio" refers to the ratio length/width.

The aspect ratio of the height H:width W is typically 1:1 (for e.g. general light source applications) or 1:2, 1:3 or 1:4 (for e.g. special light source applications such as headlamps) or 4:3, 16:10, 16:9 or 256:135 (for e.g. display applications). The light guides generally comprise a light input surface and a light exit surface which are not arranged in parallel planes, and in embodiments the light input surface is perpendicular to the light exit surface. In order to achieve a high brightness, concentrated, light output, the area of light exit surface may be smaller than the area of the light input surface. The light exit surface can have any shape, but is in an embodiment shaped as a square, rectangle, round, oval, triangle, pentagon, or hexagon.

Transparent light guides may in embodiments comprise a transparent substrate on which a plurality of light sources, for example LEDs, is grown epitaxially. The substrate is in embodiments a single crystal substrate, such as for example a sapphire substrate. The transparent growth substrate of the light sources is in these embodiments the light concentrating light guide.

The generally rod shaped or bar shaped light guide can have any cross sectional shape, but in embodiments has a cross section the shape of a square, rectangle, round, oval, triangle, pentagon, or hexagon. Generally the light guides are cuboid, but may be provided with a different shape than a cuboid, with the light input surface having somewhat the shape of a trapezoid. By doing so, the light flux may be even enhanced, which may be advantageous for some applications. Hence, in some instances the term "width" may also refer to diameter, such as in the case of a waveguide having a round cross section.

The light guides may also be cylindrically shaped rods. In embodiments the cylindrically shaped rods have one flattened surface along the longitudinal direction of the rod and at which the light sources may be positioned for efficient incoupling of light emitted by the light sources into the light guide. The flattened surface may also be used for placing heat sinks. The cylindrical light guide may also have two flattened surfaces, for example located opposite to each other or positioned perpendicular to each other. In embodiments the flattened surface extends along a part of the longitudinal direction of the cylindrical rod.

The light guides as set forth below in embodiments according to the invention may also be folded, bended and/or shaped in the length direction such that the light guide is not a straight, linear bar or rod, but may comprise, for example, a rounded corner in the form of a 90 or 180 degrees bend, a U-shape, a circular or elliptical shape, a loop or a 3-dimensional spiral shape having multiple loops. This provides for a compact light guide of which the total length, along which generally the light is guided, is relatively large, leading to a relatively high lumen output, but can at the same time be arranged into a relatively small space. For example luminescent parts of the light guide may be rigid while transparent parts of the light guide are flexible to provide for the shaping of the light guide along its length direction. The light sources may be placed anywhere along the length of the folded, bended and/or shaped light guide.

Suitable materials for the light guides as set forth below according to embodiments of the invention are sapphire, polycrystalline alumina and/or undoped transparent garnets such as YAG, LuAG having a refractive index in the range of n=1.7-1.8. An additional advantage of this material (above e.g. glass) is that it has a good thermal conductivity, thus diminishing local heating. Other suitable materials include, but are not limited to, glass, quartz and transparent polymers. In other embodiments the light guide material is lead glass. Lead glass is a variety of glass in which lead replaces the calcium content of a typical potash glass and in this way the refractive index can be increased. Ordinary glass has a refractive index of n=1.5, while the addition of lead produces a refractive index ranging up to 1.7.

The light guides as set forth below according to embodiments of the invention may comprise a suitable luminescent material for converting the light to another spectral distribution. Suitable luminescent materials include inorganic phosphors, such as doped YAG, LuAG, organic phosphors, organic fluorescent dyes and quantum dots, etc., which are highly suitable for the purposes of embodiments of the present invention as set forth below.

Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide ($CuInS_2$) and/or silver indium sulfide ($AgInS_2$) can also be used. Quantum dots show very narrow emission band and thus they show saturated colors. Furthermore the emission color can easily be tuned by adapting the size of the quantum dots. Any type of quantum dot known in the art may be used in embodiments of the present invention as set forth below. However, it may be preferred for reasons of environmental safety and concern to use cadmium-free quantum dots or at least quantum dots having very low cadmium content.

The term "quantum dots" or "luminescent quantum dots" may also refer to a combination of different type of quantum dots, i.e. quantum dots that have different spectral properties. The QDs are herein also indicated as "wavelength converter nanoparticles". The term "quantum dots" especially refer to quantum dots that luminescence in one or more of the UV, visible and IR (upon excitation with suitable radiation, such as UV radiation).

The quantum dots or luminescent nanoparticles, which are herein indicated as wavelength converter nanoparticles, may for instance comprise group II-VI compound semiconductor quantum dots selected from the group consisting of (core-shell quantum dots, with the core selected from the group consisting of) CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe. In another embodiment, the luminescent nanoparticles may for instance be group III-V compound semiconductor quantum dots selected from the group consisting of (core-shell quantum dots, with the core selected from the group consisting of) GaN, GaP, GaAs, AlN, AlP, AlAs, InN, InP, InGaP, InAs, GaNP, GaNAs, GaPAs, AlNP, AlNAs, AlPAs, InNP, InNAs, InPAs, GaAlNP, GaAlNAs, GaAlPAs, GaInNP, GaInNAs, GaInPAs, InAlNP, InAlNAs, and InAlPAs. In yet a further embodiment, the luminescent nanoparticles may for instance be I-III-VI2 chalcopyrite-type semiconductor quantum dots selected from the group consisting of (core-shell quantum dots, with the core selected from the group consisting of) $CuInS_2$, $CuInSe_2$, $CuGaS_2$, $CuGaSe_2$, $AgInS_2$, $AgInSe_2$, $AgGaS_2$, and $AgGaSe_2$. In yet a further embodiment, the luminescent nanoparticles may for instance be (core-shell quantum dots, with the core selected from the group consisting of) I-V-VI2 semiconductor quantum dots, such as selected from the group consisting of (core-shell quantum dots, with the core selected from the group consisting of) $LiAsSe_2$, $NaAsSe_2$ and $KAsSe_2$. In yet a further embodiment, the luminescent nanoparticles may for instance be core-shell quantum dots, with the core selected from the group consisting of) group (IV-VI compound semiconductor nano crystals such as SbTe. In a specific embodiment, the luminescent nanoparticles are selected from the group consisting of (core-shell quantum dots, with the core selected from the group consisting of) InP, $CuInS_2$, $CuInSe_2$, CdTe, CdSe, CdSeTe, $AgInS_2$ and $AgInSe_2$. In yet a further embodiment, the luminescent nanoparticles may for instance be one of the group (of core-shell quantum dots, with the core selected from the group consisting of) II-VI, III-V, I-III-V and IV-VI compound semiconductor nano crystals selected from the materials described above with inside dopants such as ZnSe:Mn, ZnS:Mn. The dopant elements could be selected from Mn, Ag, Zn, Eu, S, P, Cu, Ce, Tb, Au, Pb, Tb, Sb, Sn and Tl. Herein, the luminescent nanoparticles based luminescent material may also comprise different types of QDs, such as CdSe and ZnSe:Mn.

It appears to be especially advantageous to use II-VI quantum dots. Hence, in an embodiment the semiconductor based luminescent quantum dots comprise II-VI quantum dots, especially selected from the group consisting of (core-shell quantum dots, with the core selected from the group consisting of) CdS, CdSe, CdTe, ZnS, ZnSe, ZnTe, HgS, HgSe, HgTe, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, CdZnSeS, CdZnSeTe, CdZnSTe, CdHgSeS, CdHgSeTe, CdHgSTe, HgZnSeS, HgZnSeTe and HgZnSTe, even more especially selected from the group consisting of CdS, CdSe, CdSe/CdS and CdSe/CdS/ZnS.

In an embodiment, nanoparticles can comprise semiconductor nanocrystals including a core comprising a first semiconductor material and a shell comprising a second semiconductor material, wherein the shell is disposed over at least a portion of a surface of the core. A semiconductor nanocrystal including a core and shell is also referred to as a "core/shell" semiconductor nanocrystal. Any of the materials indicated above may especially be used as core. Therefore, the phrase "core-shell quantum dots, with the core selected from the group consisting of" is applied in some of the above lists of quantum dot materials. The term "core-shell" may also refer to "core-shell-shell", etc., including gradient alloy shell, or dots in rods, etc. Examples of semiconductor nanocrystal (core)shell materials include, without limitation: red (e.g., (CdSe)ZnS (core)shell), green (e.g., (CdZnSe)CdZnS (core)shell, etc.), and blue (e.g., (CdS)CdZnS (core)shell (see further also above for examples of specific wavelength converter nanoparticles, based on semiconductors.

In an embodiment, semiconductor nanocrystals preferably have ligands attached thereto, such as e.g. described in WO 2011/031871. In an embodiment, the ligands can be derived from the coordinating solvent used during the growth process. In an embodiment, the surface can be modified by repeated exposure to an excess of a competing coordinating group to form an overlayer.

Organic fluorescent dyes can be used as well. The molecular structure can be designed such that the spectral peak position can be tuned. Examples of suitable organic fluorescent dyes materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

Relevant examples of organic luminescent materials are e.g. perylenes (such as luminescent materials known under their trade name Lumogen from the company BASF, Ludwigshafen, Germany: Lumogen F240 Orange, Lumogen F300 Red Lumogen F305 Red, Lumogen F083 Yellow, Lumogen F170 Yellow, Lumogen F850 Green), Yellow 172 from the company Neelikon Food Dyes & Chemical Ltd., Mumbai, India, India, and luminescent materials such as coumarins (for example Coumarin 6, Coumarin 7, Coumarin 30, Coumarin 153, Basic Yellow 51), napthalimides (for example Solvent Yellow 11, Solvent Yellow 116), Fluorol 7GA, pyridines (for example pyridine 1), pyrromethenes (such as Pyrromethene 546, Pyrromethene 567), uranine, rhodamines (for example Rhodamine 110, Rhodamine B, Rhodamine 6G, Rhodamine 3B, Rhodamine 101, Sulphorhodamine 101, Sulphorhodamine 640, Basic Violet 11, Basic Red 2), cyanines (for example phthalocyanine, DCM), stilbenes (for example Bis-MSB, DPS), available from many traders. Several other luminescent materials, such as acid dyes, basic dyes, direct dyes and dispersion dyes may be used as long as they show a sufficiently high fluorescence quantum yield for the intended use. Organic materials of special interest that may be applied comprise for instance BASF Lumogen 850 for green luminescence, BASF Lumogen F083 or F170 for yellow luminescence, BASF Lumogen F 240 for orange luminescence, and BASF Lumogen F 300 or F305 for red luminescence.

Such organic luminescent material is especially embedded in a matrix, thereby forming the waveguide. The matrix may especially comprise an aromatic polyester, or a copolymer thereof, such as e.g. polycarbonate (PC), poly (methyl)methacrylate (P(M)MA), polyglycolide or polyglycolic acid (PGA), polylactic acid (PLA), polycaprolactone (PCL), polyethylene adipate (PEA), polyhydroxy alkanoate (PHA), polyhydroxy butyrate (PHB), poly(3-hydroxybutyrate-co-3-hydroxyvalerate) (PHBV), polyethylene terephthalate (PET), polybutylene terephthalate (PBT), polytrimethylene terephthalate (PTT), polyethylene naphthalate (PEN); especially, the matrix may comprise polyethylene terephthalate (PET). Further, as will also be elucidated below the matrix may comprise a further luminescent material embedded in the matrix. However, (PETG) (glycol modified polyethylene terephthalate), PDMS (polydimethylsiloxane), COC (cyclo olefin copolymer) PE (polyethylene), or PP (polypropylene) may also be applied as matrix. Hence, the matrix is especially a polymeric matrix.

The luminescent material may also be an inorganic phosphor. Examples of inorganic phosphor materials include, but are not limited to, cerium (Ce) doped YAG ($Y_3Al_5O_{12}$) or LuAG ($Lu_3A_{15}O_{12}$). Ce doped YAG emits yellowish light, whereas Ce doped LuAG emits yellow-greenish light.

Examples of other inorganic phosphors materials which emit red light may include, but are not limited to ECAS and BSSN; ECAS being $Ca_{1-x}AlSiN_3$:Eu$x$ wherein $0<x\leq1$, in other embodiments $0<x\leq0.2$; and BSSN being $Ba_{2-x-z}M_xSi_{5-y}AlyN_{8-y}O_y$:Eu$_z$ wherein M represents Sr or Ca, $0\leq x\leq 1$, $0<y\leq 4$, and $0.0005\leq z\leq 0.05$, and in embodiments $0\leq x\leq 0.2$.

In embodiments of the invention as set forth below, the luminescent material is made of material selected from the group comprising $(M<I>_{(1-x-y)}M<II>_xM<III>_y)_3 (M<IV>_{(1-z)} M<V>_z)_5O_{12}$ where M<I> is selected from the group comprising Y, Lu or mixtures thereof, M<II> is selected from the group comprising Gd, Tb, La, Yb or mixtures thereof, M<III> is selected from the group comprising Tb (when M<II> is not Tb), Pr, Ce, Er, Nd, Eu or mixtures thereof, M<IV> is Al, M<V> is selected from the group comprising Ga, Sc or mixtures thereof, such as Ce doped Yttrium aluminum garnet (YAG, $Y_3Al_5O_{12}$) and Ce doped Lutetium-Aluminum-Garnet (LuAG); and $0\leq x\leq1$, $0<y\leq 0.1$, $0<z<1$, $(M<I>_{(1-x-y)} M<II>_xM<III>_y)_2O_3$ where M<I> is selected from the group comprising Y, Lu or mixtures thereof, M<II> is selected from the group comprising Gd, La, Yb or mixtures thereof, M<III> is selected from the group comprising Tb, Pr, Ce, Er, Nd, Eu, Bi, Sb or mixtures thereof; and $0<x\leq 1$, $0<y\leq 0.1$, $(M<I>_{(1-x-y)} M<II>_x M<III>_y) S_{(1-z)}$ Se where M<I> is selected from the group comprising Ca, Sr, Mg, Ba or mixtures thereof, M<II> is selected from the group comprising Ce, Eu, Mn, Tb, Sm, Pr, Sb, Sn or mixtures thereof, M<III> is selected from the group comprising K, Na, Li, Rb, Zn or mixtures thereof, and $0<x\leq 0.01$, $0<y\leq 0.05$, $0\leq z<1$; $(M<I>_{(1-x-y)} M<II>_x M<III>_y)O$ where M<I> is selected from the group comprising Ca, Sr, Mg, Ba or mixtures thereof, M<II> is selected from the group comprising Ce, Eu, Mn, Tb, Sm, Pr or mixtures thereof, M<III> is selected from the group comprising K, Na, Li, Rb, Zn or mixtures thereof, and $0<x\leq 0.1$, $0<y\leq 0.1$; $(M<I>_{(2-x)} M<II>_x M<III>_2)O_7$ where M<I> is selected from the group comprising La, Y, Gd, Lu, Ba, Sr or mixtures thereof, M<II> is selected from the group comprising Eu, Tb, Pr, Ce, Nd, Sm, Tm or mixtures thereof, M<III> is selected from the group comprising Hf, Zr, Ti, Ta, Nb or mixtures thereof, and $0<x\leq 1$; $(M<I>_{(1-x)} M<II>_x M<III>_{(1-y)} M<IV>_y)O_3$ where M<I> is selected from the group comprising Ba, Sr, Ca, La, Y, Gd, Lu or mixtures thereof, M<II> is selected from the group comprising Eu, Tb, Pr, Ce, Nd, Sm, Tm or mixtures thereof, M<III> is selected from the group comprising Hf, Zr, Ti, Ta, Nb or mixtures thereof, and M<IV> is selected from the group comprising Al, Ga, Sc, Si or mixtures thereof, and $0<x\leq 0.1$, $0<y\leq 0.1$, or mixtures thereof.

Some specific inorganic luminescent materials are discussed hereafter. Several options for green emitters are possible, including one or more of (Ca,Sr,Ba)(Al,Ga,In)$_2$(O, S,Se)$_4$:Eu$^{2+}$, a thiogallate, especially such luminescent material at least comprising Sr, Ga and S, such as SrGa$_2$S$_4$: Eu$^{2+}$. These types of luminescent materials may especially be narrow band green emitters.

Optionally or alternatively, the inorganic luminescent material may comprise a $M_3A_5O_{12}$:Ce$^{3+}$ (garnet material), wherein M is selected from the group consisting of Sc, Y, Tb, Gd, and Lu, wherein A is selected from the group consisting of Al and Ga. Preferably, M at least comprises one or more of Y and Lu, and wherein A at least comprises Al. These types of materials may give highest efficiencies. Embodiments of garnets especially include $M_3A_5O_{12}$ garnets, wherein M comprises at least yttrium or lutetium and wherein A comprises at least aluminum. Such a garnet may be doped with cerium (Ce), with praseodymium (Pr) or a combination of cerium and praseodymium; especially however with at least Ce. Especially, A comprises aluminum (Al), however, A may also partly comprise gallium (Ga) and/or scandium (Sc) and/or indium (In), especially up to about 20% of Al, more especially up to about 10% of Al (i.e. the A ions essentially consist of 90 or more mole % of Al and 10 or less mole % of one or more of Ga, Sc and In); A may especially comprise up to about 10% gallium. In another variant, A and O may at least partly be replaced by Si and N. The element M may especially be selected from the group consisting of yttrium (Y), gadolinium (Gd), terbium (Tb) and lutetium (Lu). Further, Gd and/or Tb are especially only present up to an amount of about 20% of M. In a specific embodiment, the garnet luminescent material comprises $(Y_{1-x}Lu_x)_3Al_5O_{12}$:Ce, wherein x is equal to or larger than 0 and equal to or smaller than 1. The term ":Ce" or ":$Ce^{3+}$", indicates that part of the metal ions (i.e. in the garnets: part of the "M" ions) in the luminescent material is replaced by Ce. Especially a lutetium comprising garnet may provide the desired luminescence, especially when lutetium is at least 50% of M. Additionally or alternatively, the inorganic luminescent material may also comprise a luminescent material selected from the group consisting of divalent europium containing nitride luminescent material or a divalent europium containing oxonitride luminescent material, such as one or more materials selected from the group consisting of (Ba,Sr,Ca)S:Eu, (Mg,Sr,Ca)AlSiN$_3$:Eu and (Ba,Sr,Ca)$_2$Si$_5$N$_8$:Eu. In these compounds, europium (Eu) is substantially or only divalent, and replaces one or more of the indicated divalent cations. In general, Eu will not be present in amounts larger than 10% of the cation, especially in the range of about 0.5-10%, more especially in the range of about 0.5-5% relative to the cation(s) it replaces. The term ":Eu" or ":$Eu^{2+}$", indicates that part of the metal ions is replaced by Eu (in these examples by $Eu^{2+}$). For instance, assuming 2% Eu in CaAlSiN$_3$:Eu, the correct formula could be (Ca$_{0.98}$Eu$_{0.02}$)AlSiN$_3$. Divalent europium will in general replace divalent cations, such as the above divalent alkaline earth cations, especially Ca, Sr or Ba. The material (Ba,Sr,Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material (Ba,Sr,Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50-100%, especially 50-90% Ba and 50-0%, especially 50-10% Sr, such as Ba$_{1.5}$Sr$_{0.5}$Si$_5$N$_8$:Eu, (i.e. 75% Ba; 25% Sr). Here, Eu is introduced and replaces at least part of M i.e. one or more of Ba, Sr, and Ca). Likewise, the material (Ba,Sr,Ca)AlSiN$_3$: Eu can also be indicated as MAlSiN$_3$:Eu wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Preferably, in an embodiment the inorganic luminescent material comprises (Ca,Sr,Mg) AlSiN$_3$:Eu, preferably CaAlSiN$_3$:Eu. Further, in another embodiment, which may be combined with the former, the inorganic luminescent material comprises (Ca,Sr,Ba)$_2$Si$_5$N$_8$: Eu, preferably (Sr,Ba)$_2$Si$_5$N$_8$:Eu. The terms "(Ca,Sr,Ba)" indicate that the corresponding cation may be occupied by calcium, strontium or barium. It also indicates that in such material corresponding cation sites may be occupied with cations selected from the group consisting of calcium, strontium and barium. Thus, the material may for instance comprise calcium and strontium, or only strontium, etc.

The inorganic luminescent material may also comprise one or more luminescent materials selected from the group consisting of a trivalent cerium containing garnet (see above) and a trivalent cerium containing oxonitride. The oxonitride materials are in the art often also indicated as oxynitride materials.

The term "inorganic luminescent material" may thus also relate to a plurality of different inorganic luminescent materials. The inorganic luminescent material may be comprised by the light converter, such as embedded in the matrix, like especially the organic luminescent material.

Combinations of two or more of such configurations are also possible (see also above). Hence, in an embodiment the (in)organic luminescent material, such as the quantum dot based luminescent material, is embedded (i.e. distributed) in the matrix. In other instance, especially in case of the inorganic luminescent materials, even more especially in the case of the garnet-based luminescent materials, such materials may be shaped into a (ceramic) waveguide and may thus be used as such.

Many of the above-mentioned materials, especially the garnet materials, can be provided as ceramics (ceramic body or ceramic slab). The term "ceramic" especially relates to an inorganic material that is obtainable by heating a (poly crystalline) powder, like at least 500° C., especially at least 800° C., such as at least 1000° C., under high pressure, such as at least 0.5 MPa, like especially at least 1 MPa, like 1 to about 500 MPa, such as at least 5 MPa, or at least 10 MPa, especially under uniaxial or isostatic pressure, especially under isostatic pressure. A specific method to obtain a ceramic is hot isostatic pressing (HIP), whereas the HIP process may be a post-sinter HIP, capsule HIP or combined sinter-HIP process, like under the temperature and pressure conditions as indicate above. The ceramic obtainable by such method may be used as such, or may be further processed (like polishing, or even processing into particles again). A ceramic especially has density that is at least 90%, such as at least 95%, like in the range of 97-100%, of the theoretical density (i.e. the density of a single crystal). A ceramic may still be polycrystalline, but with a reduced, or strongly reduced volume between grains (pressed particles or pressed agglomerate particles).

The waveguide without the radiation converter element will in general be highly transmissive (especially transparent), like a single crystal, a polymeric material or a ceramic material. The transmission may be close to 100%. With the radiation converter element however, at least part of the radiation is strongly absorbed; for this radiation absorbed by the radiation converter element, the waveguide including the radiation converter element is hardly transmissive. The term "transmissive" herein may especially refer to a converter that has a light transmission in the range of 90-100%, such as 95-100%, for light having a wavelength selected from the visible wavelength range. Herein, the term "visible light" especially relates to light having a wavelength selected from the range of 380-780 nm. The transmission can be determined by providing light at a specific wavelength with a first intensity to the waveguide under perpendicular radiation and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989). The waveguides may comprise, or essentially consist of, one or more materials that are highly transparent, and would have a transmission (through the width W of the waveguide) for the solid state light source radiation of 90% or more especially 95% or more, even more especially 98% or more, even more especially 99% or more, in the absence of the radiation converter element.

A luminescent light guide may comprise a central emission wavelength within a blue color-range or within a green color-range or within a red color-range. The blue color-range is defined between 380 nanometer and 495 nanometer, the green color-range is defined between 495 nanometer and 590 nanometer, and the red color-range is defined between 590 nanometer and 800 nanometer.

A selection of phosphors which may be used in embodiments, alternative to or in addition to the phosphors described above, is given in the table below along with the maximum emission wavelength.

| Phosphor | Maximum emission wavelength [nm] |
|---|---|
| $CaGa_2S_4$:Ce | 475 |
| $SrGa_2S_4$:Ce | 450 |
| $BaAl_2S_4$:Eu | 470 |
| $CaF_2$:Eu | 435 |
| $Bi_4Si_3O_{12}$:Ce | 470 |
| $Ca_3Sc_2Si_3O_{12}$:Ce | 490 |

The above emission maxima may in the present invention be red-shifted, due to reabsorption.

The light guides as set forth below according to embodiments of the invention may comprise regions with a different density of suitable luminescent material for converting the light to another spectral distribution. In an embodiment a transparent light guide comprises two parts adjacent to each other and only one of which comprises a luminescent material and the other part is transparent or has a relatively low concentration of luminescent material. In another embodiment the light guide comprises yet another, third part, adjacent to the second part, which comprises a different luminescent material or a different concentration of the same luminescent material. The different parts may be integrally formed thus forming one piece or one light guide. Would such embodiments be used, than the average concentration over the width is applied. For instance, assume a waveguide with two layers, with the first concentration in a first layer being 2 and in a second layer being 0, then the concentration is 1.

In embodiments of the light emitting device according to the invention as set forth below a coupling structure or a coupling medium may be provided for efficiently coupling the light emitted by the light source into the light guide. The coupling structure may be a refractive structure having features, such as e.g. protrusions and recesses forming a wave shaped structure. The typical size of the features of the coupling structure is 5 µm to 500 µm. The shape of the features may be e.g. hemispherical (lenses), prismatic, sinusoidal or random (e.g. sand-blasted). By choosing the appropriate shape, the amount of light coupled into the light guide can be tuned. The refractive structures may be made by mechanical means such as by chiseling, sand blasting or the like. Alternatively, the refractive structures may be made by replication in an appropriate material, such as e.g. polymer or sol-gel material. Alternatively, the coupling structure may be a diffractive structure, where the typical size of the features of the diffractive coupling structure is 0.2 µm to 2 µm. The diffraction angles $\theta_{in}$ inside the light guide are given by the grating equation $\lambda/\Lambda = n_{in} \cdot \sin \theta_{in} - n_{out} \cdot \sin \theta_{out}$, where $\lambda$ is the wavelength of LED light, $\Lambda$ is the grating period, $n_{in}$ and $n_{out}$ are the refractive indices inside and outside the light guide, $\theta_{in}$ and $\theta_{out}$ are the diffraction angle inside and the incident angle outside the light guide, respectively. If we assume the same refractive index $n_{out}=1$ for low-index layer and coupling medium, we find, with the condition for total internal reflection $n_{in} \sin \theta_{in} = n_{out}$, the following condition: $\lambda/\Lambda = 1 - \sin \theta_{out}$, i.e. $\Lambda = \lambda$ for normal incidence $\theta_{out}=0$. Generally, not all other angles $\theta_{out}$ are diffracted into the light guide. This will happen only if its refractive index $n_{in}$ is high enough. From the grating equation it follows that for the condition $n_{in} \geq 2$ all angles are diffracted if $\Lambda = \lambda$. Also other periods and refractive indices may be used, leading to less light that is diffracted into the light guide. Furthermore, in general a lot of light is transmitted ($0^{th}$ order). The amount of diffracted light depends on the shape and height of the grating structures. By choosing the appropriate parameters, the amount of light coupled into the light guide can be tuned. Such diffractive structures most easily are made by replication from structures that have been made by e.g. e-beam lithography or holography. The replication may be done by a method like soft nano-imprint lithography. The coupling medium may e.g. be air or another suitable material.

Turning now to FIG. 1, a 3-dimensional perspective view of a light emitting device 1 is shown comprising a concentrator 100, which comprises a light guide 4000 adapted for converting incoming light with a first spectral distribution to light with a second, different spectral distribution. The light guide 4000 shown in FIG. 1 comprises or is constructed as a wavelength converter structure 6000 having a first conversion part 6110 in the form of a UV to blue wavelength converter and a second conversion part 6120 in the form of a phosphor adapted to emit white light 1400 based on the blue light input from the first conversion part 6110. Hence, the light emitting device 1 shown in FIG. 1 comprises a light source in the form of a plurality of LEDs 2100, 2200, 2300 emitting light in the UV to blue wavelength range. The LEDs 2100, 2200, 2300 are arranged on a base or substrate 1500. Particularly, the first conversion part 6110 comprises a polycrystalline cubic Yttrium Aluminum Garnet (YAG), doped with rare earth ions, in an embodiment Europium and/or Terbium, while the second conversion part 6120 comprises a yellow phosphor. This embodiment is advantageous in that the surface area of the light exit surface is smaller than the surface area required to build a light source consisting of direct light emitting LEDs. Thereby, a gain in etendue can be realized.

Alternatives for generating white light with a blue or UV light source include but are not limited to LEDs emitting blue light, which light is converted to green/blue light in the first conversion part 6110, which in turn is converted to white light by the second conversion part being provided as a red phosphor, and LEDs emitting blue light, which light is converted to green light in the first conversion part 6110, which in turn is mixed with red and blue light to generate a white LED source, wherein the mixing is achieved by means of a second conversion part in the form of a red phosphor in front of which a diffusor is arranged.

In another embodiment, the plurality of LEDs includes two or more subsets configured to provide radiation with different spectral distributions. For instance, a first subset may be configured to generate UV or blue radiation and a second subset is configured to generate blue or green radiation, respectively.

Further, the lighting device may include further optical elements, either separate from the waveguide and/or integrated in the waveguide, like e.g. a light concentrating element, such as a compound parabolic light concentrating element (CPC).

Figure 2:
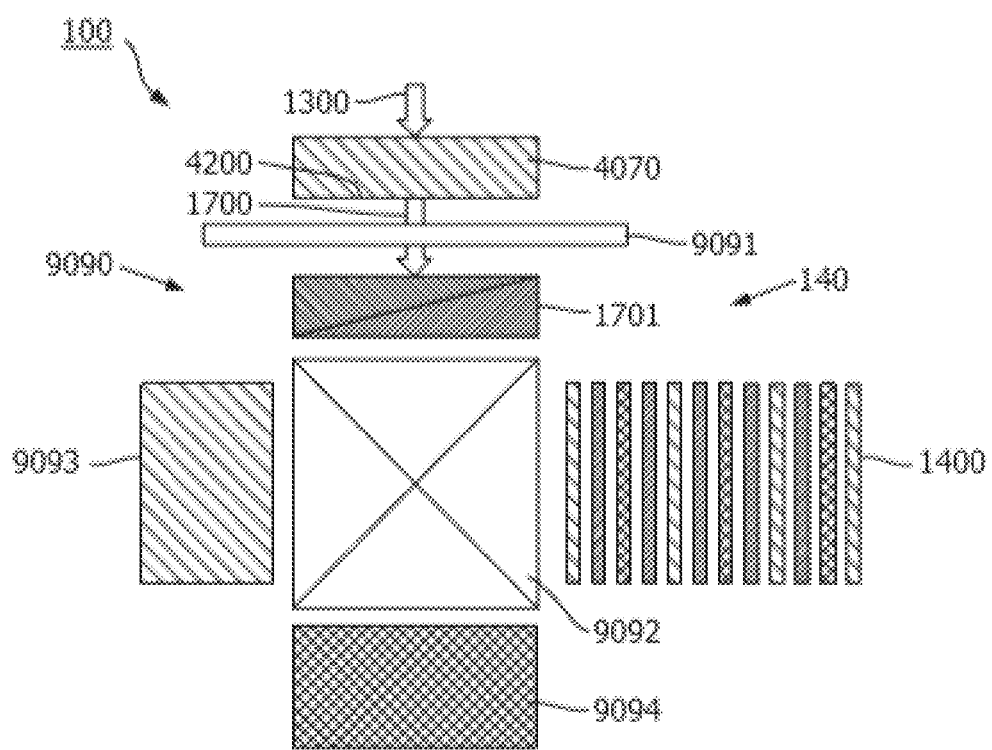
FIG. 2 shows a side view of a lighting system with a light guide and additional light sources and which is provided with a filter and a dichroic optical element.

FIG. 2 shows a side view of a lighting system including the light emitting device 1 comprising a concentrator 100 of FIG. 1, e.g. a digital projector unit 140, with a light guide 4070 which is adapted for converting incident light 1300 in such a way that the emitted light 1700 is in the yellow and/or orange wavelength range, i.e. roughly in the wavelength range of 560 nm to 600 nm. The light guide 4070 may e.g. be provided as a transparent garnet made of ceramic materials such as Ce-doped $(Lu,Gd)_3Al_5O_{12}$, $(Y,Gd)_3Al_5O_{12}$ or $(Y,Tb)_3Al_5O_{12}$. With higher Ce-content and/or higher substitution levels of e.g. Gd and/or Tb in favor of Ce, the spectral distribution of the light emitted by the light guide can be shifted to higher wavelengths. In an embodiment, the light guide 4070 is fully transparent.

At the light exit surface 4200 an optical element 9090 is provided. The optical element 9090 comprises a filter 9091 for filtering the light 1700 emitted from the light guide 4070 such as to provide filtered light 1701, at least one further light source 9093, 9094 and an optical component 9092 adapted for combining the filtered light 1701 and the light from the at least one further light source 9093, 9094 such as to provide a common light output 1400. The filter 9091 may be an absorption filter or a reflective filter, which may be fixed or switchable. A switchable filter may e.g. be obtained by providing a reflective dichroic mirror, which may be low-pass, band-pass or high-pass according to the desired light output, and a switchable mirror and placing the switchable mirror upstream of the dichroic mirror seen in the light propagation direction. Furthermore, it is also feasible to combine two or more filters and/or mirrors to select a desired light output. The filter 9091 shown in FIG. 2 is a switchable filter enabling the transmission of unfiltered yellow and/or orange light or filtered light, particularly and in the embodiment shown filtered red light, according to the switching state of the filter 9091. The spectral distribution of the filtered light depends on the characteristics of the filter 9091 employed. The optical component 9092 as shown may be a cross dichroic prism also known as an X-cube or it may in an alternative be a suitable set of individual dichroic filters.

In the embodiment shown two further light sources 9093 and 9094 are provided, the further light source 9093 being a blue light source and the further light source 9094 being a green light source. Other colors and/or a higher number of further light sources may be feasible too. One or more of the further light sources may also be light guides according to embodiments of the invention as set forth below. A further option is to use the light filtered out by the filter 9091 as a further light source. The common light output 1400 is thus a combination of light 1701 emitted by the light guide 4070 and filtered by the filter 9091 and light emitted by the respective two further light sources 9093 and 9094. The common light output 1400 may advantageously be white light.

The solution shown in FIG. 2 is advantageous in that it is scalable, cost effective and easily adaptable according to the requirements for a given application of a light emitting device according to embodiments of the invention. The invention is not limited to the digital projector embodiment schematically depicted in FIG. 2.

FIGS. 3A to 3D show side views of concentrators 103A, 103B, 103C and 103D, which comprise a light guide 4010A, 4010B, 4010C and 4010D, respectively, comprising a light polarizing element 9001 arranged adjacent to the light exit surface 4200 of the respective light guide 4010A, 4010B, 4010C, 4010D as well as a reflective element 7400 arranged at a surface 4600 of the respective light guide 4010A, 4010B, 4010C, 4010D extending opposite to the light exit surface 4200. Thereby a polarized light source having a high brightness and a high efficiency may be obtained. Irrespective of the embodiment the polarizing element 9001 may be any one of a reflective linear polarizer and a reflective circular polarizer. Wire grid polarizers, reflective polarizers based on stack of polymer layers comprising birefringent layers are examples of reflective linear polarizers. Circular polarizers can be obtained using polymers in the so-called cholesteric liquid crystal phase to make so-called cholesteric polarizers transmitting only light of one polarization and of a specific spectral distribution. Alternatively or in addition to the reflective polarizers, polarizing beam splitters can also be employed. Furthermore scattering polarizers can also be used. In another embodiment, polarization by reflection may be used, e.g. by means of a polarizing element in the form of a wedge made of a material like glass, in which light is incident close to the Brewster angle. In yet another embodiment, the polarizing element 9001 may be a so-called polarized backlight such as described in WO 2007/036877 A2. In yet another embodiment, the polarizing element 9001 may be a polarizing structure.

Figure 3A:
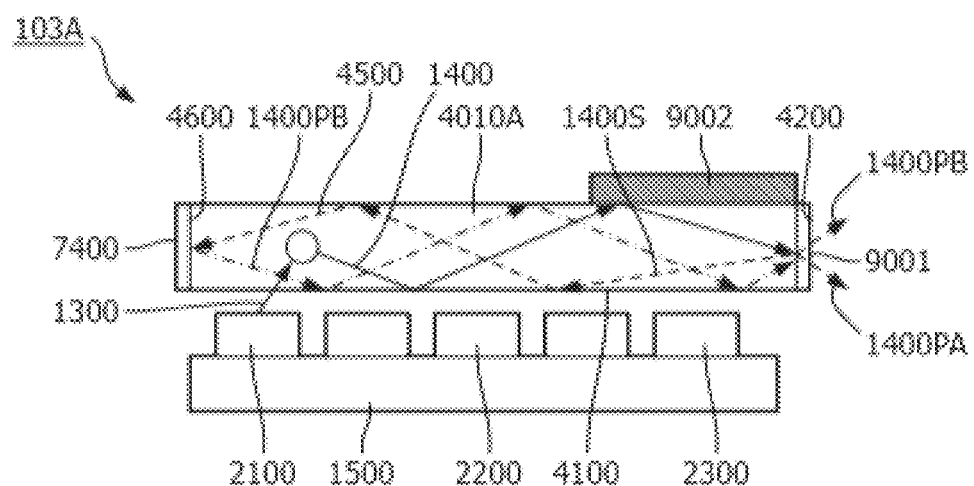
FIGS. 3A to 3D show light guides provided with a polarizing element arranged adjacent to the light exit surface of the light guide.

FIG. 3A shows an embodiment in which the polarizing element 9001 is arranged on the light exit surface 4200 of the light guide 4010A. The light sources 2100, 2200, 2300 emit first light 1300 (elsewhere indicated as solid state light source radiation 11) having a first spectral distribution, which is converted in the light guide 4010A into second light 1400 (elsewhere indicated as converter element radiation 21) having a second spectral distribution. Due to the polarizing element 9001 only light of a first polarization, in this case p-polarized light 1400PA, is transmitted and emitted from the light exit surface 4200 and light of a second polarization, in this case s-polarized light 1400S, is reflected back into the light guide 4010A. The reflected s-polarized light 1400S is reflected by the reflective element 7400. When reflected, at least a part of the reflected s-polarized light 1400S is altered into p-polarized light 1400PB which is transmitted by the polarizing element 9001. Thus, a light output comprising only light with a first polarization, in this case p-polarized light 1400PA, 1400PB is obtained.

Furthermore, in this example the light guide 4010A comprises a ¼ lambda plate 9002 arranged at one of the surfaces extending between the light exit surface 4200 and the opposite surface 4600, in the embodiment shown partially covering the surface 4500. Alternatively, the ¼ lambda plate may cover the surface 4500 completely or it may comprise two or more separate segments. Alternatively or in addition thereto, further ¼ lambda plates may be arranged at one or more other of the surfaces extending between the light exit surface 4200 and the surface 4600. In yet another embodiment the ¼ lambda plate 9002 may be arranged between the light guide and the reflective element 7400 such that a gap is provided between the ¼ lambda plate and the light guide. The ¼ lambda plate 9002 may be used for converting light with a first polarization into light with a second polarization, particularly for converting circularly polarized light into linearly polarized light. It is noted, however, that irrespective of the embodiment the ¼ lambda plate 9002 is an optional element, and that it thus may also be omitted.

Figure 3B:
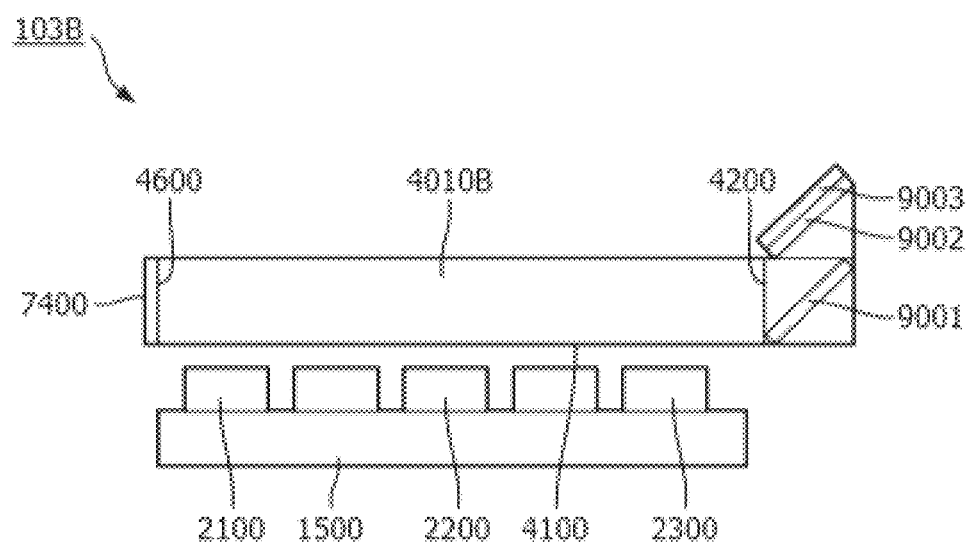

FIG. 3B shows an embodiment in which a polarizing element 9001B is arranged angled with respect to the light exit surface 4200, as shown in an angle of 45° relative to the light exit surface 4200 although any angle is in principle feasible. Furthermore, a ¼ lambda plate 9002B and a reflective element 9003 stacked on top of each other are arranged in the beam path downstream of the polarizing element 9001B such that they extend substantially in parallel with the polarizing element 9001B. Thereby, reflected light with a first polarization is coupled out of the light guide 4010B and is thereupon altered into light with a second polarization by the polarizing element 9001B, Subsequently the light with the second polarization is redirected by the reflective element 9003 and further polarized by the ¼ lambda plate 9002B.

Figure 3C:
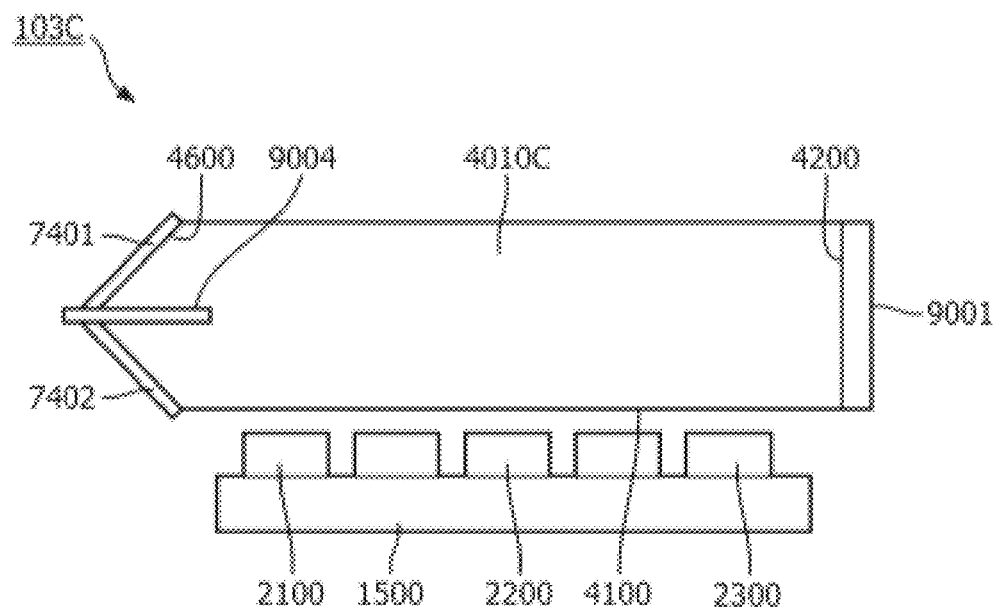

FIG. 3C shows an embodiment very similar to that shown in FIG. 9i-\ but according to which the light guide 4010C as an alternative comprises a tapered surface 4600C opposite to the light exit surface 4200. The tapered surface 4600C is provided with reflective elements 4701, 4702 separated by an insert in the form of ½ lambda plate 9004.

Figure 3D:
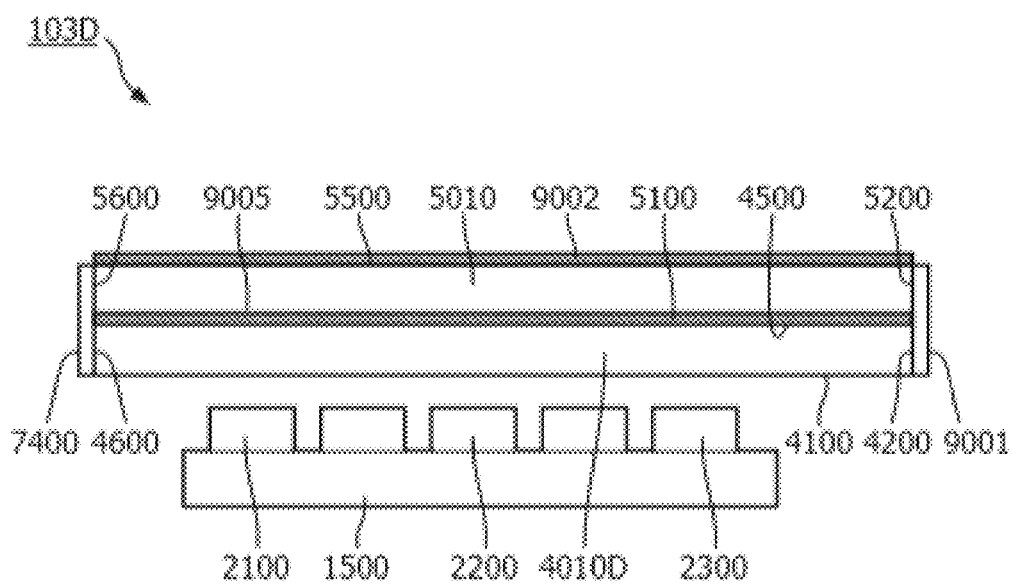

FIG. 3D shows an embodiment in which two light guides 4010D and 5010 are stacked such that the surface 4500 of the light guide 4010D and the light input surface 5100 of the light guide 5010 face each other and with a further polarizing element 9005 arranged in between and in optical contact with the light guides 4010D and 5010. A polarizing element 9001D is arranged on the light exit surfaces 4200 and 5200 of the light guides 4010D and 5010 and a reflective element 7400 is arranged on the surfaces 4600D and 5600 of the light guides 4010D and 5010 opposite the respective light exit surfaces 4200, 5200. The further polarizing element 9005 transmits light with a polarization being perpendicular to the polarization of the light transmitted by the polarizing element 9001D. A ¼ lambda plate 9002D may be applied to at least a part of the surface 5500 of the light guide 5010.

In further alternative embodiments the polarizing element 9001 may be provided as a part of an optical element arranged at the light exit surface 4200 of the light guide. In one particular embodiment the polarizing element 9001 is then arranged such as to be located opposite to the light exit surface 4200 in the mounted position of the optical element. By way of example such an optical element may for instance be an optical element, a compound parabolic light concentrating element (CPC) or an optical element as described above. Alternatively, such an optical element may be a light mixing chamber. Particularly in case of a CPC a ¼ lambda plate may be arranged in the CPC opposite to the polarizing element 9001.

Figure 4:
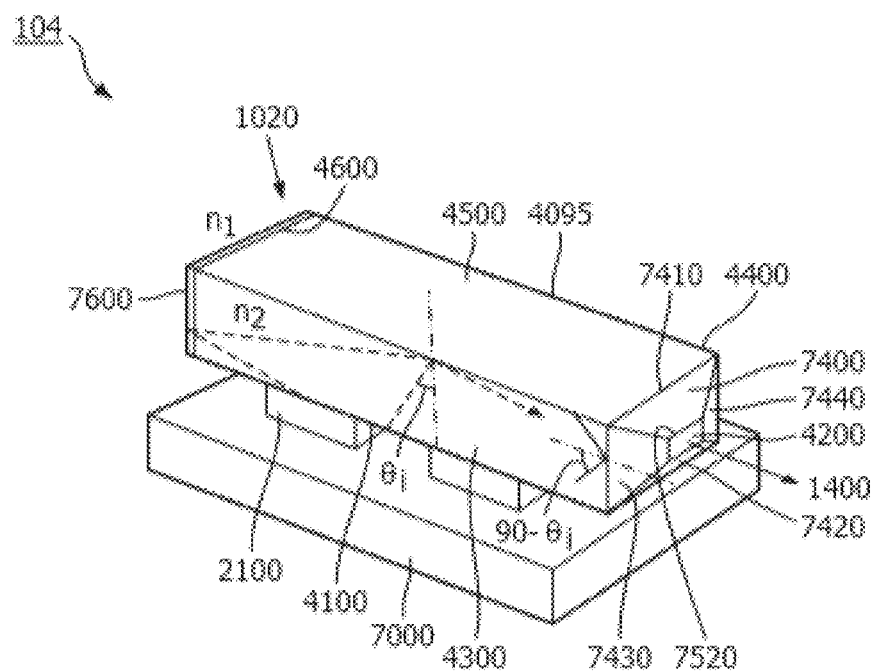
FIG. 4 shows a perspective view of a light emitting device having a tapered exit surface.

FIG. 4 shows a light emitting device 1020 comprising a light source 2100 comprising a plurality of LEDs and a concentrator 104, which comprises light guide 4095. The light source 2100 is in this example arranged on a base or substrate in the form of a heat sink 7000, in embodiments made of a metal such as copper, iron or aluminum. It is noted that in other embodiments the base or substrate need not be a heat sink. The light guide 4095 is shown shaped generally as a bar or rod having a light input surface 4100 and a light exit surface 4200 extending in an angle different from zero, in this particular case perpendicular, with respect to one another such that the light exit surface 4200 is an end surface of the light guide 4095. The light input surface 4100 and the light exit surface 4200 may have different sizes, in embodiments such that the light input surface 4100 is larger than the light exit surface 4200. The light guide 4095 further comprises a further surface 4600 extending parallel to and opposite the light exit surface 4200, the further surface 4600 thus likewise being an end surface of the light guide 4095.

The light guide 4095 further comprises side surfaces 4300, 4400, 4500. The light guide 4095 may also be plate shaped, e.g. as a square or rectangular plate.

The light emitting device 1020 further comprises a first mirror element 7600 arranged at the further surface 4600 of the light guide 4095 as well as a second mirror element 7400 arranged at the light exit surface 4200 of the light guide 4095. As shown the first mirror element 7600 is arranged in optical contact with the light exit surface 4200 and the second mirror element 7600 is arranged in optical contact with the further surface 4600. Alternatively, a gap may be provided between one or both of the first and the second mirror element 7600 and 7400 and the further surface 4600 and the light exit surface 4200, respectively. Such a gap may be filled with e.g. air or an optical adhesive.

The light exit surface 4200 of the light guide 4095 is further provided with four inwardly tapered walls and a central flat part extending parallel with the further surface 4600. By "tapered wall" as used herein is meant a wall segment of the light exit surface 4200 which is arranged in an angle different from zero degrees to both the remaining part(s) of the light exit surface and to the surfaces of the light guide extending adjacent to the light exit surface. The walls are tapered inwardly, meaning that the cross-section of the light guide is gradually decreasing towards the exit surface. In this embodiment a second mirror element 7400 is arranged at, and is in optical contact with, the tapered walls of the light exit surface 4200. Hence, the second mirror element is provided with four segments 7410, 7420, 7430 and 7410 corresponding to and covering each of the tapered walls of the light exit surface 4200. A through opening 7520 corresponding to the central flat part of the light exit surface 4200 defines a transparent part of the light exit surface 4200 through which light may exit to be emitted from the light emitting device 1020.

In this way a light emitting device is provided in which the light rays that hit the second mirror element change angular direction such that more light rays are directed towards the light exit surface 4200 and light rays that previously would remain within the light guide 4095 due to TIR due to the change in angular directions now hit the light exit surface 4200 with angles smaller than the critical angle of reflection and consequently may leave the light guide through the through opening 7520 of the light exit surface 4200. Thereby the intensity of the light emitted by the light emitting device through the light exit surface 4200 of the light guide 4095 is increased further. Particularly, when the light guide is a rectangular bar, there will be light rays that hit the second mirror element at the exit surface perpendicularly, and as such cannot leave the bar since they remain bouncing between the two mirror elements. When one mirror element is tilted inwards, the light rays change direction after being reflected at that mirror element and may leave the light guide via the transparent part of the second mirror element. Thus, this configuration provides for improved guidance of light towards the central flat part of the light exit surface 4200 and thus the through hole 7520 in the second mirror element 7400 by means of reflection off of the tapered walls.

In alternative embodiments other numbers of tapered walls, such as less or more than four, e.g. one, two, three, five or six tapered walls, may be provided, and similarly not all tapered walls need be provided with a second mirror element or segments thereof. In other alternatives, one or more of the tapered walls may be uncovered by the second mirror element 7400, and/or the central flat part may be covered partly or fully by the second mirror element 7400.

Figures 5A, 5B:
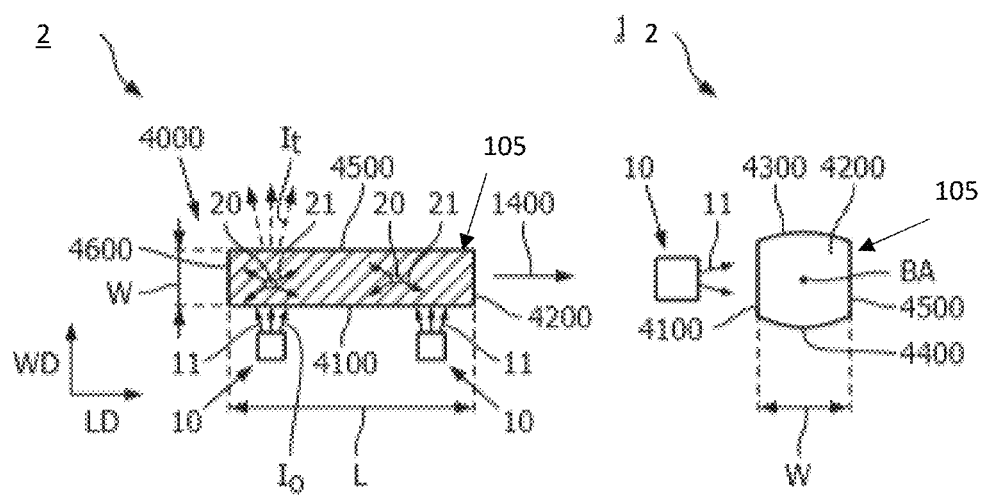
FIGS. 5A-5B schematically depict some embodiments.

FIG. 5A schematically depicts an embodiment of the lighting device, indicated with reference 2. The lighting device 2 comprises a luminescent concentrator 105, comprising waveguide 4000 having radiation input face 4100 and radiation exit face 4200. Width W is defined by a distance between the radiation input face 4100 and opposite face 4500, the waveguide 4000 comprising a radiation converter element 20 distributed in the waveguide 4000. Here, width W equals the thickness of the waveguide 4000 (and the path length (l), see also above)). Further, the lighting device 2 comprises a solid state light source 10 configured to irradiate with solid state light source radiation 11 the radiation input face 4100 of the waveguide 4000. Here, by way of example only two solid state light sources 10 are depicted. The radiation converter element 20, such as $Ce^{3+}$ or $Eu^{2+}$, or an organic dye, or a QD, or combinations of two or more thereof, is (are) configured to absorb at least part of the light source radiation 11 and to convert into radiation converter element radiation 21. The waveguide 4000 can e.g. be a beam or rod, but may also have substantially spherical cross-section. An embodiment thereof is schematically depicted in FIG. 5B, with input face 4100 and opposite face 4500 which are made substantially parallel; the other faces may be round, or rounded. However, the back end 4600 (not depicted) and the exit face 4200 will in general have a flat part, or be entirely substantially flat ("flattened surface", see also above). In FIG. 5A radiation escaping from the waveguide 4000 at radiation exit face 4200 is indicated with reference 1400. The length of the waveguide 4000 is indicated with reference L. The length direction (LD) is e.g. parallel to faces 4100 and 4500, and may especially coincide with a body axis (not depicted). In FIG. 5B the length direction would be perpendicular to the plane of drawing and is indicate with body axis BA. The length direction is perpendicular to the width (direction). Radiation 11 from the radiation sources 10 travels parallel to the width direction (WD). These directions WD and LD are also indicated with the arrows right of the waveguide 4000. The concentrator 100 includes the waveguide 4000, but may optionally include further elements like filters, reflectors, etc., as indicated above.

Figure 6A:
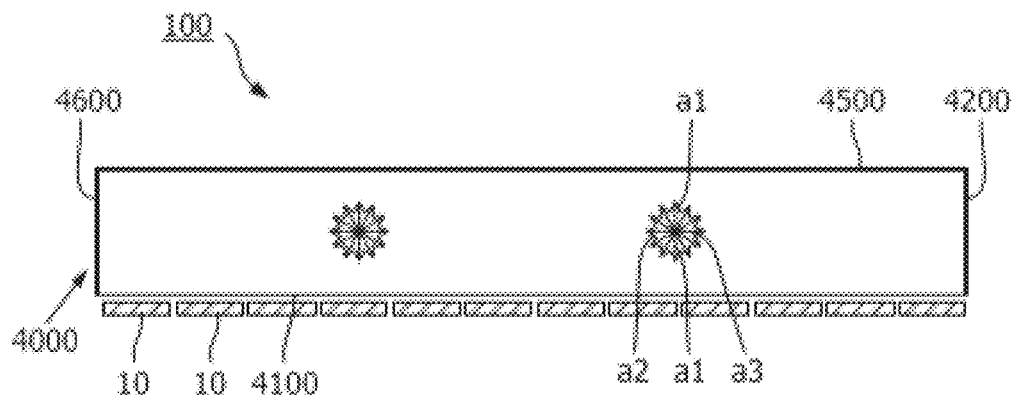
FIGS. 6A-6D schematically depict some aspects of the invention.
Figure 6B:
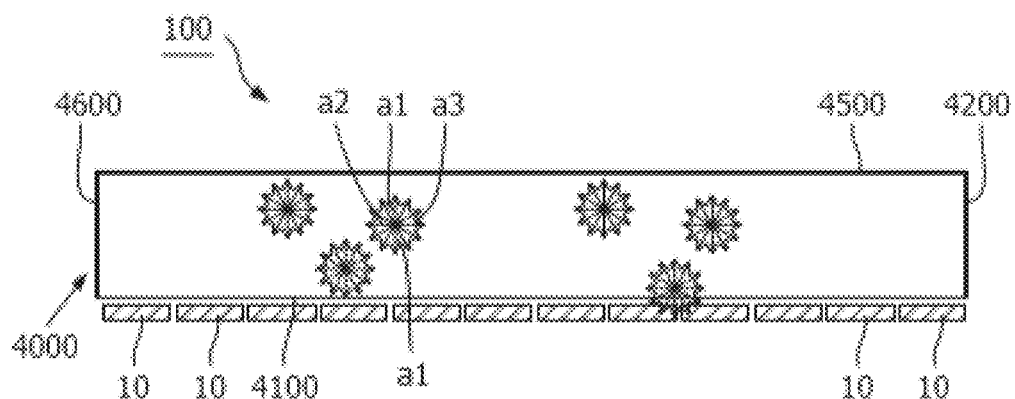

FIGS. 6A and 6B schematically show that in the case that the concentration of activator is low, re-absorption in the length direction of the rod is dominant (see FIG. 6A). Reabsorption in the width direction is negligible; due to the high aspect ratio of the rod, reabsorption in the length direction will always occur. Light that was originally in TIR, is likely to escape from TIR due this reabsorption process. Moreover, light that was in the primary emission not in TIR, will have a lower chance to be re-absorbed and will escape from the rod before it reaches the exit surface. If we increase the dopant concentration (see FIG. 6B) also re-absorption in other directions becomes important. The primary light generated that is not in the TIR cone will undergo reabsorption, giving it a second chance to enter the TIR cone. In the length direction, re-absorption will not increase significantly; only the distance from the primary emission will decrease (the aspect ratio of the rod, defined as length over width ratio, results in reabsorption in the length direction, even for lower concentrations). Reference a1 indicates radiation that is not within the total internal reflection regime (in both directions the TIR cone is depicted in this schematic 2D drawing), and may thus be lost. Reference a2 indicates the radiation which is within the TIR of the long faces 4100 and 4500, but not with the TIR of the back side 4600. Reference a3 indicates the radiation within the TIR leaving the exit surface 200.

Figure 6C:
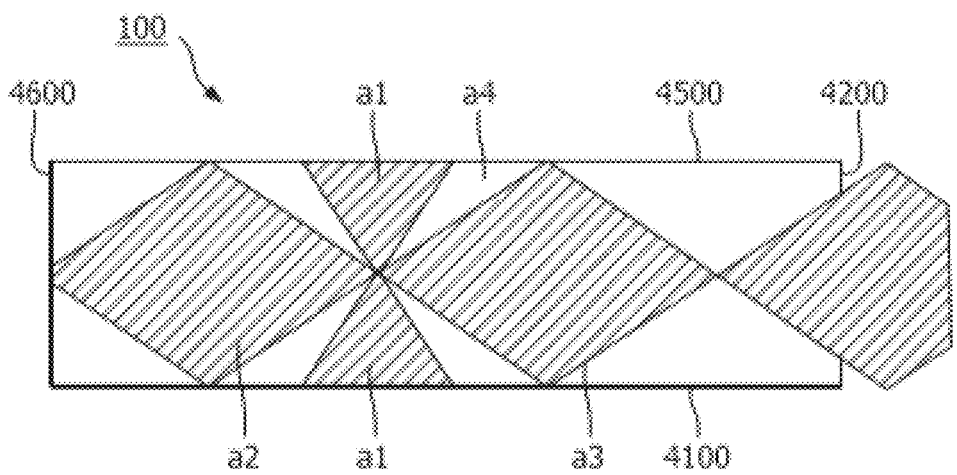

Some quantification is given with reference to FIG. 6C, wherein a cerium containing garnet waveguide is assumed, with the waveguide having an index of refraction of 1.8 (and air having an index of refraction of 1). Then, the critical angle can be determined at 33.7°. Reference a4 indicates the light within the TIR of all faces. The radiation a1 not within the TIR can be estimated at (4*33.7)/360=37.5%, with the factor 4 being based on the top two half cones and the bottom two half cones (opening angle of the entire a1 cones is thus) 2*33.7°). Radiation a2 can be estimated at (2*33.7/360)=18.7% and radiation a3 can be estimated at (2*33.7/360)=18.7%, with the factors 2 being based on the two half cones of a2 and a3, respectively. Radiation a4 can be estimated at (4*22.6/360)=25%; the value of 22.6 is based on 2*(45°–33.7°=11.3°). As can be seen in FIG. 6C, there are four a4 parts, hence this value is quadrupled. Assume that about 15% of the radiation can undergo reabsorption, then the possible gain is than given by: (light in cones 'a1')*(fraction of that light that still has the possibility to undergo reabsorption)*(chance that the re-emitted light has a correct emission angle) which is thus about 0.375*0.15*(1−0.375)=4%, which is substantial.

In the table below, some examples are given:

| Width rod (mm) | Type of luminescent material | Converter element | Converter element concentration for 98% absorption at maximum excitation wavelength | Example of presently desired concentration |
|---|---|---|---|---|
| 1.2 | $Lu_3Al_5O_{12}:Ce^{3+}$ | $Ce^{3+}$ | 0.175% | 0.7% |
| 1.2 | $Ca_{1-x}AlSiN_3:Eu_x^{2+}$ | $Eu^{2+}$ | 0.1-0.15% | 0.4-0.6% |

For quantum dots a similar calculation was made, but then based on the concentration of the quantum dots per liter waveguide. A characteristic value for quantum dots is =$1e^6$ $M^{-1}cm^{-1}$, M being defined as mol per liter. Hence, 98% absorption over 0.12 cm is $-\log(0.02)=1e^6*0.12*[C]$, with [C] indicating the concentration. Hence, the 98% absorption concentration for such type of quantum dots is 15 μM. Therefore, a desired concentration is at least 45 μM in a waveguide having a thickness of 0.12 cm.

Figure 6D:
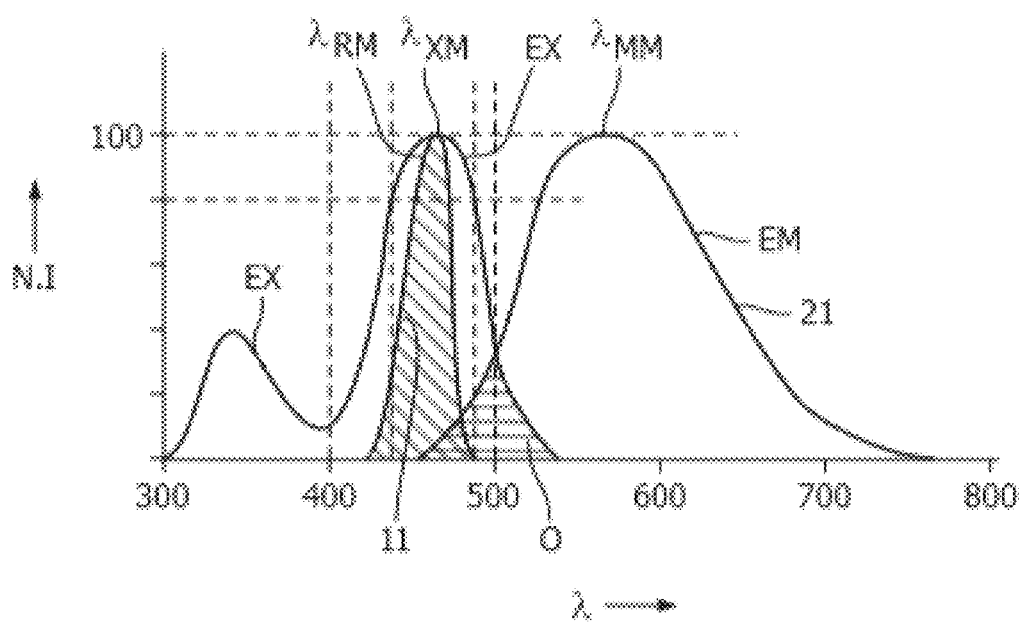

FIG. 6D schematically depicts an emission curve and associated excitation curve, with on the x-axis wavelength (λ) in nanometer (nm) and on the y-axis normalized intensity (N.I.) (in arbitrary units). For the sake of argument, the absorption curve is defined as being identical to the excitation curve, especially within the relevant wavelength range of 400-600, especially even 300-600 nm. The excitation or absorption curve is identified with reference EX. The emission curve is identified with reference EM, i.e. the radiation converter element radiation 21. Further, the (diagonally) dashed curve is the solid state light source radiation 11. The curves are normalized. It is apparent that the radiation converter element can be excited over nearly the whole wavelength range of 300-500 in this example. However, most efficient excitation will be in the range around the maximum $\lambda_{XM}$, i.e. the excitation maximum. The solid state light source radiation has a maximum at radiation maximum $\lambda_{RM}$. Especially, the solid state light source is chosen such that its radiation maximum $\lambda_{RM}$ is within the range of 70-100% of $\lambda_{XM}$. In the drawing, the 80-100% range is indicated. Here, in this embodiment the solid state light source radiation overlaps substantially completely with the excitation band, and the maxima $\lambda_{XM}$ and $\lambda_{RM}$ are substantially on top of each other. Further, the emission band and excitation band overlap. Here, in this schematic drawing about 10-15% of the emission band EM (radiation converter element radiation 21) overlaps with the excitation band. The spectral overlap is determined by normalizing the excitation spectrum and emission spectrum in the visible range to 100 (or 1, etc.), and defining the area under the emission curve overlapping with the area under the excitation curve. For a good reabsorption such overlap is beneficial. The overlapping area is (horizontally) dashed and is indicated with reference O. The wavelength at maximum emission is indicated with reference $\lambda_{MM}$. The wavelength difference between $\lambda_{XM}$ and $\lambda_{MM}$ is the Stokes shift.

The invention claimed is:

1. A lighting device comprising:
a luminescent concentrator, the luminescent concentrator comprising a waveguide having a radiation input face, a radiation exit face, and a width (W) being defined by the radiation input face and an opposite face, the waveguide comprising a radiation converter element distributed in the waveguide with a radiation converter concentration, wherein the waveguide comprises a single crystal;
a solid state light source configured to irradiate the radiation input face of the waveguide with solid state light source radiation;
wherein the radiation converter element is configured to absorb at least part of the light source radiation and to convert into radiation converter element radiation, and
wherein a concentration of the radiation converter element within the waveguide is selected to be at least three times of that necessary for the radiation converter element to absorb 98% of the light source radiation over the width (W) of the waveguide.

2. The lighting device according to claim 1, wherein the radiation converter concentration is selected to be 4-8 times of that necessary for the radiation converter element to absorb 98% of the light source radiation over the width (W) of the waveguide.

3. The lighting device according to claim 1, wherein the radiation input face has an radiation input face area (A), wherein the radiation exit face has a radiation exit face area (E), and wherein the radiation input face area (A) is at least two times larger than the radiation exit face area (E), and, wherein the radiation exit face has a radiation exit face area (E) selected from the range of 1-100 mm².

4. The lighting device according to claim 1, having a width (W) selected from the range of 0.5-100 mm, and wherein the solid state light source is not in physical contact with the waveguide.

5. The lighting device according to claim 1, comprising a plurality of solid state light sources configured to irradiate the radiation input face of the waveguide with solid state light source radiation.

6. An automotive lighting unit configured to provide visible light, wherein the automotive lighting unit comprises at least one lighting device according to claim 1.

7. A digital projector unit comprising at least one lighting device according to claim 1.

8. The lighting device according to claim 1, wherein the radiation converter element comprises a radiation excitation spectrum and a radiation emission spectrum that spectrally partly overlap.

9. The lighting device according to claim 8, wherein the radiation converter element has an emission spectrum and an excitation spectrum, wherein 5-25% of the emission spectrum overlaps with the excitation spectrum.

10. The lighting device according to claim 1, wherein the waveguide comprises a cerium doped garnet of the $A_3B_5O_{12}$ type and wherein the solid state light source is configured to irradiate the radiation input face of the waveguide with one or more of UV and blue solid state light source radiation.

11. The lighting device according to claim 10, wherein A comprises Ce and one or more of Y, Gd, Tb, La, with in the range of 0.01-2 mole % of Ce, and at least 90 mole % of Lu, relative to the total amount of A, and wherein B comprises one or more of Al, Ga and Sc, with at least 50 mole % of Al relative to the total amount of B.

12. A lighting unit configured to provide visible light, wherein the lighting unit comprises at least one lighting device according to claim 1.

13. The unit according to claim 12, wherein the at least one lighting device is configured to provide green light or red light.

14. The unit according to claim 12, comprising at least a first lighting device configured to provide green light and at least a second lighting device configured to provide red light.

* * * * *